(12) United States Patent
Kawakami et al.

(10) Patent No.: US 7,298,047 B2
(45) Date of Patent: Nov. 20, 2007

(54) ELECTRONIC CIRCUIT DEVICE

(75) Inventors: Yoshiteru Kawakami, Kanagawa (JP); Yasuharu Nakamura, Nagano (JP)

(73) Assignee: Sony Corporation, Tokyo (JP)

( * ) Notice: Subject to any disclaimer, the term of this patent is extended or adjusted under 35 U.S.C. 154(b) by 7 days.

(21) Appl. No.: 11/195,818

(22) Filed: Aug. 3, 2005

(65) Prior Publication Data
US 2006/0033199 A1 Feb. 16, 2006

(30) Foreign Application Priority Data
Aug. 11, 2004 (JP) .............................. 2004-234053

(51) Int. Cl.
  *H01L 23/48* (2006.01)
  *H01L 23/52* (2006.01)
  *H01L 29/40* (2006.01)
(52) U.S. Cl. ................ 257/758; 257/700; 257/E23.023
(58) Field of Classification Search ................ 257/758, 257/700, E23.023
See application file for complete search history.

(56) References Cited

U.S. PATENT DOCUMENTS

| 5,081,563 A | * | 1/1992 | Feng et al. | ................. | 361/795 |
| 5,306,670 A | * | 4/1994 | Mowatt et al. | ................. | 29/832 |
| 5,497,033 A | * | 3/1996 | Fillion et al. | ................. | 257/723 |
| 5,590,461 A | * | 1/1997 | Ishida | ................. | 29/830 |
| 5,597,643 A | * | 1/1997 | Weber | ................. | 428/209 |
| 6,023,413 A | * | 2/2000 | Umezawa | ................. | 361/697 |
| 6,377,461 B1 | * | 4/2002 | Ozmat et al. | ................. | 361/704 |
| 6,855,892 B2 | * | 2/2005 | Komatsu et al. | ................. | 174/256 |
| 6,991,966 B2 | * | 1/2006 | Tuominen | ................. | 438/118 |
| 7,179,742 B2 | * | 2/2007 | Nuytkens et al. | ................. | 438/678 |
| 2001/0010569 A1 | * | 8/2001 | Jin et al. | ................. | 349/58 |
| 2001/0027605 A1 | * | 10/2001 | Nabemoto et al. | ................. | 29/830 |
| 2004/0227227 A1 | * | 11/2004 | Imanaka et al. | ................. | 257/700 |

OTHER PUBLICATIONS

U.S. Appl. No. 11/195,818, filed Aug. 3, 2005, Kawakami et al.
U.S. Appl. No. 11/195,719, filed Aug. 3, 2005, Kawakami et al.

* cited by examiner

*Primary Examiner*—B. William Baumeister
*Assistant Examiner*—Igwe U. Anya
(74) *Attorney, Agent, or Firm*—Oblon, Spivak, McClelland, Maier & Neustadt, P.C.

(57) ABSTRACT

An electronic circuit device includes at least a first substrate and a second substrate, a spacer substrate interposed between the first substrate and the second substrate, an electronic component interposed between the first substrate and the second substrate, and at least one through-hole formed on the second circuit substrate opposing the first circuit substrate. The spacer substrate mutually connects the first substrate and the second substrate. The electronic component is connected to the first circuit substrate with the active surface of the electronic component. The through-hole penetrates from a first surface of the second circuit substrate opposing the first substrate to a second surface of the second circuit substrate. The first circuit substrate is connected to the electronic component.

15 Claims, 16 Drawing Sheets

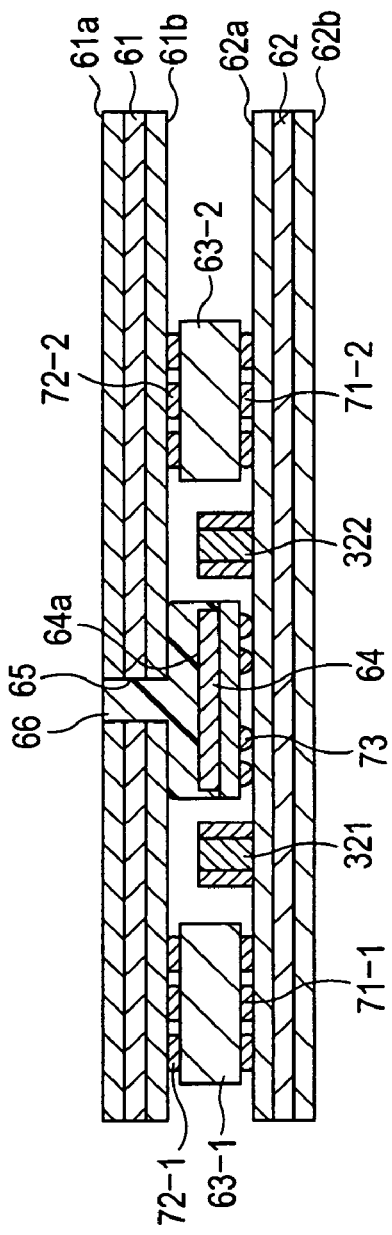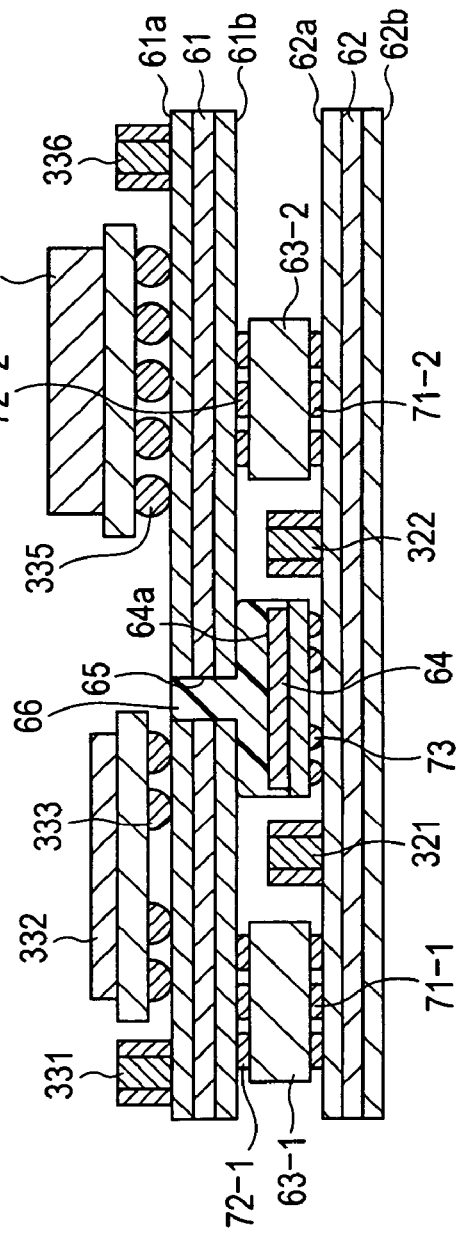

ELECTRONIC CIRCUIT DEVICE

CROSS REFERENCES TO RELATED APPLICATIONS

The present invention contains subject matter related to Japanese Patent Application JP 2004-234053 filed in the Japanese Patent Office on Aug. 11, 2004, the entire contents of which are incorporated herein by reference.

BACKGROUND OF THE INVENTION

1. Field of the Invention

The present invention relates to an electronic circuit device and, more specifically, relates to an electronic circuit device capable of dissipating heat generated by an electronic component included in the electronic circuit device.

2. Description of the Related Art

In the past, multilayer substrates for embedding electronic components so as to obtain highly dense and highly integrated electronic components, such as semiconductor chips (e.g., PCT Japanese Translation Patent Publication No. 7-107954).

A method for producing a known multilayer substrate with embedded electronic components will be briefly described in sequence below with reference to FIGS. 1 and 2.

FIG. 1A illustrates a substrate 1. On one of the surfaces (upper surface in the drawings) of the substrate 1, wiring is provided by copper foil 2 so as to form a circuit.

As illustrated in FIG. 1B, a semiconductor chip 3 with its active surface (device surface) facing toward the substrate 1 is disposed on the substrate 1. Bumps 4 are formed on electrodes (not shown in the drawings) of the semiconductor chip 3. The semiconductor chip 3 is fixed to the substrate 1 by a bonding member, such as solder or conductive paste, and is electrically connected to the circuit via the copper foil 2. A sealing resin 5 is interposed between the semiconductor chip 3 and the substrate 1 so as to increase the connection strength between the substrate 1 and the semiconductor chip 3 and to prevent intrusion of moisture.

Next, as illustrated in FIG. 1C, the upper surface of the substrate 1 with the semiconductor chip 3 is flattened by applying a resin 6. On the surface of the substrate 1 flattened by the resin 6, wiring is provided by the copper foil 7, a circuit is formed, and a substrate 8 is stacked.

As illustrated in FIG. 2, through-holes are formed in the substrate 1 and the substrate 8 from the upper surface of the substrate 8 to the lower surface of the substrate 1 in positions where the semiconductor chip is not disposed. By plating each of the through-holes entirely with a conductive material, such as copper, through-holes 9 are formed. Circuits composed of copper foil 10 are formed on the upper surface of the substrate 8 and are electrically connected to the through-holes 9. Other circuits composed of copper foil 11 are formed on the lower surface of the substrate 1 and are electrically connected to the through-holes 9. In this way, a multilayer substrate 21 is produced.

As described above, the known multilayer substrate 21 is produced by including the semiconductor chip 3 in the multilayer substrate 21 as part of the multilayer substrate 21.

Recently, in the technological field of mobile phones and home information appliances, there has been a demand for reduction in size and weight and improvement in advanced functions. For this reason, highly efficient electronic devices have been in demand for mobile phones and home information appliances. However, many of these highly efficient electronic devices generate high-temperature heat.

SUMMARY OF THE INVENTION

The above-described known multilayer substrate 21 includes the semiconductor chip 3 flatted by the resin 6 and/or surrounded by the substrates 1 and 8. Therefore, it is difficult to dissipate the heat generated by the semiconductor chip 3 to outside the multilayer substrate 21.

The electronic circuit device according to an embodiment of the present invention has taken into consideration the above-described problem and is capable of dissipating heat generated from electronic components embedded in the electronic circuit device.

The electronic circuit device according to an embodiment of the present invention includes at least a first substrate and a second substrate, a spacer substrate interposed between the first substrate and the second substrate, an electronic component interposed between the first substrate and the second substrate, and at least one through-hole formed on the second circuit substrate opposing the first circuit substrate. The spacer substrate mutually connects the first substrate and the second substrate. The electronic component is connected to the first circuit substrate with the active surface of the electronic component. The through-hole penetrates from a first surface of the second circuit substrate opposing the first substrate to a second surface of the second circuit substrate. The first circuit substrate is connected to the electronic component.

The electronic component may be a semiconductor chip or a chip-type electronic component.

The inside of the through-hole and the space between the through-hole and a surface of the electronic component opposing the second circuit substrate may be filled with a resin having high heat conductivity.

The electronic circuit device may include a plated conductive part contacting the resin filling the space between the through-hole and a surface of the electronic component opposing the second circuit substrate and contacting an inner wall of the through-hole.

The electronic circuit device may include a fan contacting the conductive part and being disposed on the second surface of the second circuit substrate.

The electronic circuit device may include a plated conductive part for electrically connecting the first surface of the second circuit substrate and the second surface of the second circuit substrate. The conductive part is in contact with the first surface of the second circuit substrate and the inner surface of the through-hole. At least the space between the conductive part and the surface of the electronic component opposing the second circuit substrate is filled with a resin having high heat conductivity.

The electronic circuit device may include a fan contacting the conductive part and being disposed on the second surface of the second circuit substrate.

The electronic circuit device may includes a metal plate contacting the surface of the electronic component opposing the second circuit substrate, passing through the through-hole formed on the second circuit substrate, and protruding from the second surface of the second circuit substrate and a fan contacting the metal plate.

According to an embodiment of the present invention, a spacer substrate interposed between a first circuit substrate and a second circuit substrate mutually connects the first circuit substrate and the second circuit substrate, and an electronic component is connect to an active surface of the first circuit substrate. At least one through-hole is formed on the second circuit substrate opposing the first circuit substrate connected to the electronic component so that the through-hole penetrates though the second circuit substrate from the surface opposing the first circuit substrate to the other surface.

The electronic circuit device according to an embodiment of the present invention is capable of dissipating heat generated by the electronic component embedded in the electronic circuit device. Moreover, the electronic circuit device according to an embodiment of the present invention is capable of preventing malfunction of the electronic component caused by heat generated within the electronic circuit device.

Now, the relationship between the aspects of the present invention and the embodiments of the present invention, which are described further below, will be described. The following descriptions are provided to assure that detailed examples of the aspects of the present invention are provided in the "Description of the Preferred Embodiments" section below. Thus, even if a detailed example described in the "Description of the Preferred Embodiments" section is not included in this section, the detailed example may correspond to an aspect of the present invention. To the contrary, even if a detailed example is described in this section as an example corresponding to an aspect of the present invention, the detailed example may correspond to aspects of the present invention other than that described in this section.

The descriptions in this section not necessarily imply that all aspects of the present invention corresponding to the detailed examples described in the "Description of the Preferred Embodiments" section are included in the claims. In other words, this section does not necessarily deny the possibility that an aspect of the present invention corresponds to the detailed examples described in the "Description of the Preferred Embodiments" section but not included in the claims will be become apparent in the future by divisional application and/or amendment.

The electronic circuit device according claim 1 (for example, electronic circuit device 51 in FIG. 3) includes a spacer substrate (for example, spacer substrate 63-1 in FIG. 3) interposed between the first substrate (for example, circuit substrate 62 in FIG. 3) and the second substrate (for example, circuit substrate 61 in FIG. 3), an electronic component (for example, electronic components 64 in FIG. 3) interposed between the first substrate and the second substrate, and at least one through-hole (for example, through-hole 65 in FIG. 3) formed on the second circuit substrate opposing the first circuit substrate. The spacer substrate mutually connects the first substrate and the second substrate. The electronic component is connected to the first circuit substrate with the active surface of the electronic component. The through-hole penetrates from a first surface (for example, lowermost surface 61b in FIG. 3) of the second circuit substrate opposing the first substrate (for example, uppermost surface 61a in FIG. 3) to a second surface of the second circuit substrate. The first circuit substrate is connected to the electronic component.

In the electronic circuit device according claim 3, inside of the through-hole and the space between the through-hole and a surface (for example, the upper surfaces 64a in FIG. 3) of the electronic component opposing the second circuit substrate may be filled with a resin (for example, heat-dissipation resin 66 in FIG. 3) having high heat conductivity.

The electronic circuit device according to claim 4 (for example, the electronic circuit device 131) includes a plated conductive part (for example, through-hole 141 in FIG. 6) contacting the resin filling the space between the through-hole and a surface of the electronic component opposing the second circuit substrate and contacting an inner wall of the through-hole.

The electronic circuit device according to claim 6 (for example, electronic circuit device 171 in FIG. 7), further includes a plated conductive part (for example, heat-dissipation vias 182 in FIG. 7) for electrically connecting a first surface (for example, lowermost surface 61b in FIG. 7) of a second circuit substrate and the second surface (for example, uppermost surface 61a in FIG. 7) of the second circuit substrate. The conductive part is in contact with the first surface of the second circuit substrate and the inner surface of a through-hole (for example, through-holes 181 in FIG. 7). At least the space between a conductive part (for example, metal thin plane 182b in FIG. 7) and the surface (for example, the upper surfaces 64a in FIG. 7) of the electronic component opposing a second circuit substrate is filled with a resin (for example, heat-dissipation resin 183 in FIG. 7) having high heat conductivity.

The electronic circuit device according to claim 8 (for example, electronic circuit device 201 in FIG. 8), further includes a metal plate (for example, heat sinks 212 in FIG. 8) contacting the surface (for example, uppermost surface 61a in FIG. 8) of the electronic component opposing a second circuit substrate (for example, circuit substrate 61 in FIG. 8), passing through a through-hole (for example, through-holes 211 in FIG. 8) formed on the second circuit substrate, and protruding from the second surface of the second circuit substrate, and a fan (for example, fans 213 in FIG. 8) contacting the metal plate.

BRIEF DESCRIPTION OF THE DRAWINGS

FIG. 14 illustrates steps in a packaging process for an electronic circuit device according to an embodiment of the present invention;

DESCRIPTION OF THE PREFERRED EMBODIMENTS

Embodiments of the present invention will be described below with reference to the drawings.

Figure 3:
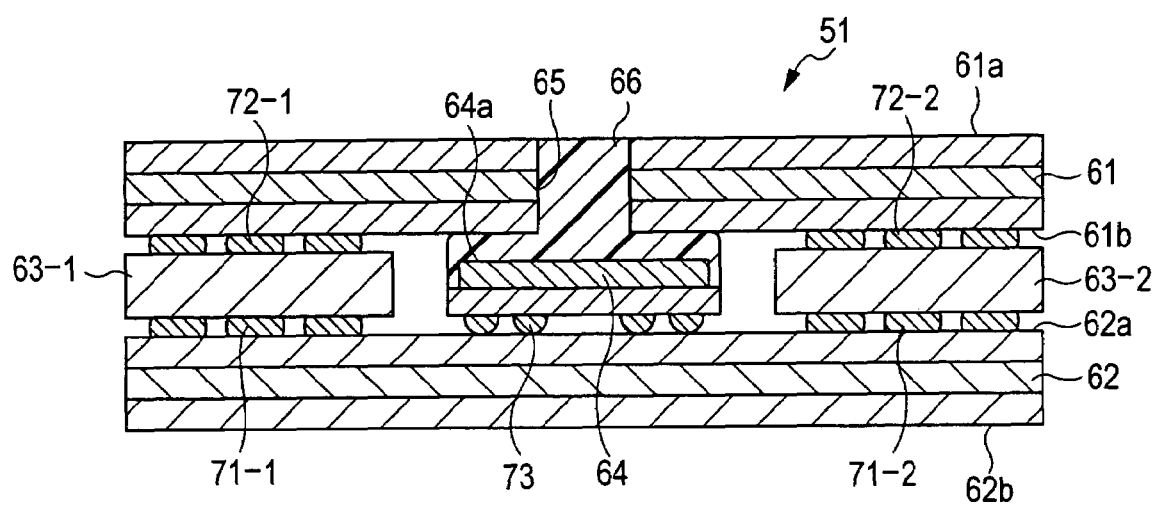
FIG. 3 is a cross-sectional view of an electronic circuit device according to an embodiment of the present invention.

FIG. 3 is a sectional side view of an electronic circuit device 51 according to an embodiment of the present invention.

The electronic circuit device 51 is constituted by stacking a circuit substrate 61 on a circuit substrate 62, wherein spacer substrates 63-1 and 63-2 and an electronic component 64 are interposed between the circuit substrate 61 and the circuit substrate 62. Hereinafter, when the spacer substrates 63-1 and 63-2 do not have to be distinguished from each other, the spacer substrates 63-1 and 63-2 will be referred to as 'spacer substrates 63.'

The circuit substrates 61 and 62 are each formed by stacking three layers including a rigid substrate. The rigid substrate is constituted of an insulating plate that is made of an electric insulator, such as glass epoxy, and has a copper-foil electric circuit (not shown in the drawing). The circuit substrates 61 and 62 may be constituted of a single rigid substrate or more than three layers of rigid substrates, and an electric circuit does not have be formed on all rigid substrates.

As illustrated from the left of the drawing, the spacer substrate 63-1, the electronic component 64, the spacer substrate 63-2 are disposed on the uppermost surface 62a (the surface opposing the circuit substrate 61) of the circuit substrate 62. More specifically, lands (not shown in the drawing) formed on the lower surfaces of the spacer substrate 63-1, the electronic component 64, and the spacer substrate 63-2 correspond to lands (not shown in the drawing) formed on the uppermost surface 62a of the circuit substrate 62. A bonding member 71-1, a bonding member 73, and a bonding member 71-2 electrically and mechanically (physically) connected the lands formed on the lower surfaces of the spacer substrate 63-1, the electronic component 64, and the spacer substrate 63-2, respectively, and the lands formed on the uppermost surface 62a of the circuit substrate 62.

Lands (not shown in the drawing) formed on the upper surfaces (surfaces opposing the circuit substrate 61) of the spacer substrate 63-1 and the spacer substrate 63-2 correspond to lands (not shown in the drawing) formed on the lowermost surface 61b of the circuit substrate 61. A bonding member 72-1 and a bonding member 72-2 electrically and mechanically connected the lands formed on the upper surfaces (surfaces opposing the circuit substrate 61) of the spacer substrate 63-1 and the spacer substrate 63-2, respectively, and the lands formed on the lowermost surface 61b of the circuit substrate 61.

On the circuit substrate 61, substantially right above of the electronic component 64 disposed on and connected to the circuit substrate 62, a through-hole 65 passing through from the uppermost surface 61a to the lowermost surface 61b of the circuit substrate 61 is formed. A heat-dissipation resin 66 is filled inside the through-holes 65 and between the lower edges of the through-holes 65 and the upper surface 64a (i.e., surface opposing the circuit substrate 61) of the electronic components 64 so that the upper surface 64a is covered with the heat-dissipation resin 66. The through-holes 65 only have to be large enough such that the heat-dissipation resin 66 can be filled inside and the diameter, for example, is 1 to 2 mm. As the heat-dissipation resin 66, a resin that can be removed from the electronic circuit device 51 when heated is used.

The spacer substrates 63, similar to the circuit substrates 61 and 62, are constituted of a rigid substrate and are capable of electrically connecting the circuit substrates 61 and 62 and are capable of maintaining a predetermined gap between the circuit substrates 61 and 62. More specifically, the distance between the circuit substrates 61 and 62 can be 0.4 to 1.6 mm depending on the thickness of the spacer substrates 63. In this way, the electronic component 64 having a thickness smaller than the gap can be interposed between the circuit substrates 61 and 62. On the upper and lower surfaces of the spacer substrates 63, lands (not shown in the drawing) made of a metal thin film are provided so as to electrically and mechanically connect the circuit substrates 61 and 62.

The electronic component 64 may be a chip-type electronic component in which a semiconductor chip that generates high heat, such as a central processing unit (CPU), a memory, or a digital signal processor, is packaged on a substrate with its active surface facing downwards on the substrate. On the lower surface of the electronic component 64 (i.e., surface opposing the circuit substrate 62), lands (not shown in the drawing) made of a metal thin film are provided.

As described above, in the electronic circuit device 51, the electronic component 64 that generates high heat is embedded in the electronic circuit device 51 by interposing the spacer substrates 63 between the stacked circuit substrates 61 and 62. The through-hole 65 is formed in the circuit substrate 61, which is the substrate opposing the active surface of the embedded electronic component 64. The resin 6 is filled inside the through-hole 65 and between the through-hole 65 and the electronic component 64 so as to cover the upper surface 64a of the electronic components 64 (i.e., surface opposing the active surface). In this way, heat generated by the electronic components 64 is dissipated to the electric circuit formed on the circuit substrate 61 by copper foil through the heat-dissipation resin 66 and the through-hole 65. The electric circuit formed on the circuit substrate 61 also functions as a ground.

Accordingly, even when the electronic component 64 that generates high heat is interposed between the stacked circuit substrates 61 and 62, heat can be efficiently dissipated and, thus, malfunction of the electronic component 64 due to heat can be prevented.

Furthermore, by filling the through-holes 65 with the heat-dissipation resin 66, the through-holes 65 are sealed and intrusion of unwanted substances, such as dust and dirt, can be prevented.

In the electronic circuit device 51, as illustrated in FIG. 3, the through-hole 65 is formed in the circuit substrate 61 substantially directly above the electronic component 64. However, the position of the through-hole 65 is not limited and may be formed anywhere so long as the heat-dissipation resin 66 can fill the space between the through-hole 65 and the electronic component 64. The heat-dissipation resin 66 should at least be in contact with the inner wall of the through-hole 65 and the upper surface 64a of the electronic component 64. Therefore, for example, the heat-dissipation resin 66 may fill the entire space between the circuit substrates 61 and 62.

However, by forming the through-holes 65 in the circuit substrate 61 substantially directly above the electronic components 64 and filling the through-hole 65 and the space between the through-hole 65 and the electronic component 64 with the heat-dissipation resin 66 so as to cover the upper surface 64a of the electronic component 64, the heat-dissipation efficiency is increased while only a minimum amount of the heat-dissipation resin 66 is required. Accordingly, production costs can be reduced.

In the electronic circuit device 51 illustrated in FIG. 3, the through-holes 65 is filled flush with the heat-dissipation resin 66. However, the through-holes 65 can be filled with the heat-dissipation resin 66 such that some of the heat-dissipation resin 66 overflows from the top of the through-holes 65.

Figure 4:
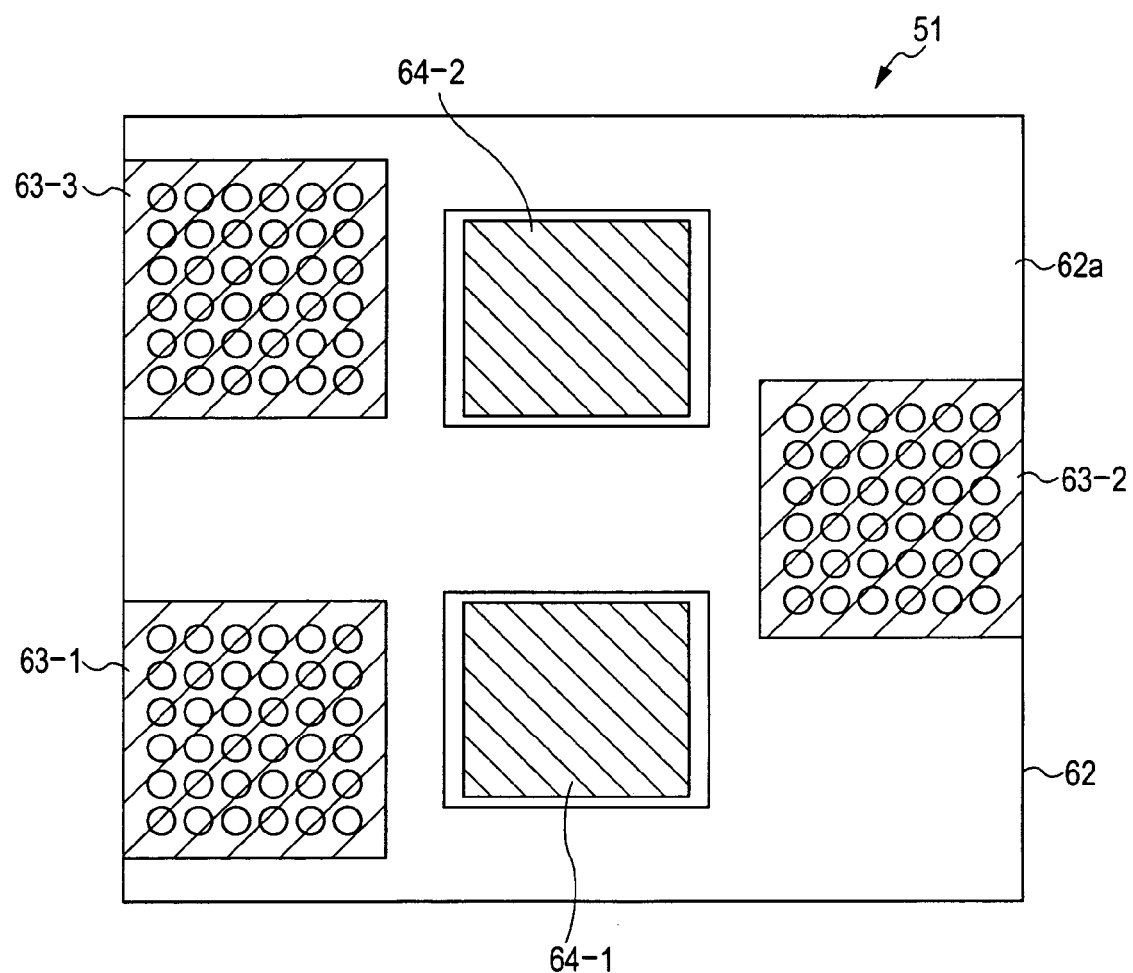
FIG. 4 is a horizontal cross-sectional view of the electronic circuit device illustrated in FIG. 3.

FIG. 4 is a horizontal cross-section of the electronic circuit device 51 illustrated in FIG. 3. More specifically, FIG. 4 is an overhead view of the uppermost surface 62a of the circuit substrate 62 connected to the spacer substrates 63-1 and 63-2 and the electronic component 64 disposed on the circuit substrate 62. The heat-dissipation resin 66 is not shown in FIG. 4.

As illustrated in FIG. 4, the spacer substrates 63-1, 63-2, and 63-3 and electronic components 64-1 and 64-2, which are connected to the electronic component 64, are disposed on the uppermost surface 62a of the electronic component 64. FIG. 4 illustrates the spacer substrate 63-4 and the electronic component 64-2 that were not viewable in FIG. 3 because of being disposed behind the spacer substrate 63-1 and the electronic component 64 (64-1), respectively.

Often, three or four the spacer substrates 63 are disposed on the circuit substrate 62. The electronic components 64 can be disposed on the uppermost surface 62a of the circuit substrate 62 in areas where the spacer substrates 63 are not disposed.

FIG. 4 illustrates the lands, which were described above with reference to FIG. 3, as circles on the spacer substrates 63.

Figure 5:
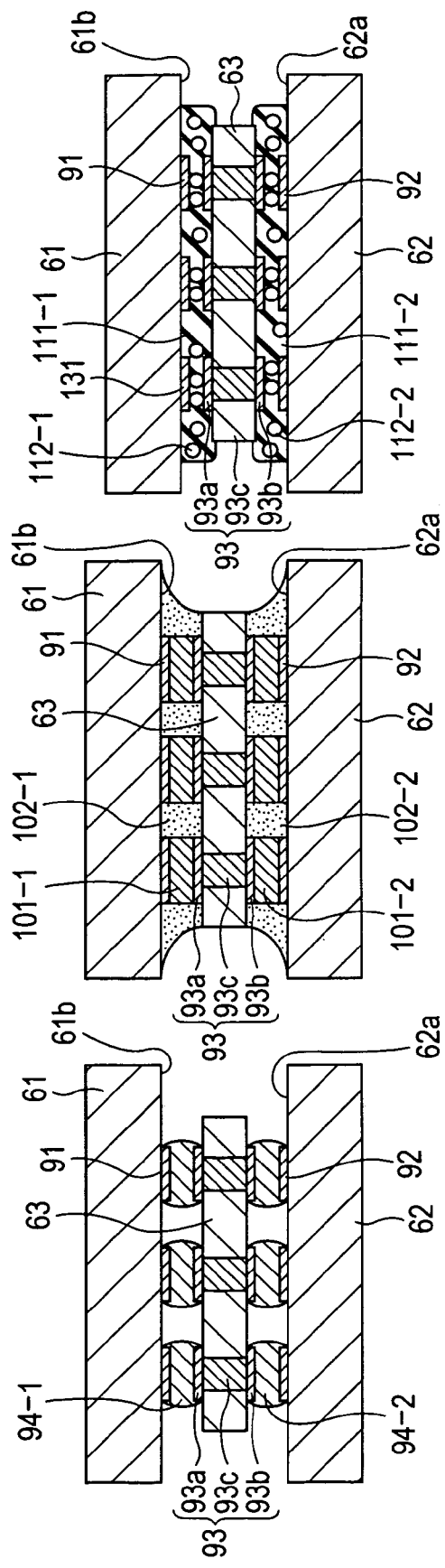
FIG. 5 illustrates a method for connecting a spacer substrate to a circuit substrate.

Now, methods for connecting the spacer substrates 63 to the circuit substrates 61 and 62, which illustrated in FIG. 3, are described below with reference to FIG. 5.

According to the method illustrated in FIG. 5A, three lands (metal thin films) 91 made of copper foil are formed on the lowermost surface 61b of the circuit substrate 61. Three lands 92 made of copper foil that correspond to the lands 91 are formed the uppermost surface 62a of the circuit substrate 62. Through-holes 93 including lands 93a corresponding to the lands 91 and lands 93b corresponding to the lands 92 are provided on the spacer substrate 63. The lands 91 and the lands 93a (through-holes 93) are connected by solder 94-1, and the lands 92 and the lands 93b (through-holes 93) are connected by solder 94-2. In this way, the circuit substrate 61 and the spacer substrates 63, and the circuit substrate 62 and the spacer substrates 63 are electrically and mechanically connected. Consequently, the circuit substrate 61 and the circuit substrate 62 are electrically and mechanically connected.

The through-holes 93 are constructed by forming through-holes in the spacer substrates 63 from a upper surface (first surface) to a lower surface (second surface) of the spacer substrates 63 at positions corresponding to the lands 91 and 92, plating the through-holes with copper so as to form metal thin films 93c in contact with the inner walls of the through-holes, and forming the lands 93a on the upper surface and the lands 93b on the lower surface by plating the lands 93a and 93b together with the metal thin films 93c.

According to the method illustrated in FIG. 5B, the three lands 91 made of copper foil are formed on the lowermost surface 61b of the circuit substrate 61. The three lands 92 made of copper foil that correspond to the lands 91 are formed the uppermost surface 62a of the circuit substrate 62. The spacer substrate 63 has the through-holes 93 formed as a unit with the lands 93a and 93b, which correspond to the lands 91 and 92, respectively. The lands 91 and the lands 93a (through-holes 93) are connected by a metal paste 101-1, such as silver (Ag) paste or copper (Cu) paste, and the lands 92 and the lands 93b (through-holes 93) are connected by a metal paste 101-1. In this way, the circuit substrate 61 and the spacer substrates 63, and the circuit substrate 62 and the spacer substrates 63 are electrically and mechanically connected. Consequently, the circuit substrate 61 and the circuit substrate 62 are electrically and mechanically connected.

According to the method illustrated in FIG. 5B, to increase connection strength between the circuit substrate 61 and the spacer substrates 63 and between the circuit substrate 62 and the spacer substrates 63 and to prevent intrusion of moisture, the space between the lowermost surface 61b of the circuit substrate 61 and the spacer substrates 63 and the space between the uppermost surface 62a of the circuit substrate 62 and the spacer substrates 63 are filled with a sealing resin 102-1 and 102-2 (dotted area in the drawings), respectively.

According to the method illustrated in FIG. 5c, the three lands 91 made of copper foil are formed on the lowermost surface 61b of the circuit substrate 61. The three lands 92 made of copper foil that correspond to the lands 91 are formed the uppermost surface 62a of the circuit substrate 62. The spacer substrate 63 has the through-holes 93 formed as a unit with the lands 93a and 93b, which correspond to the lands 91 and 92, respectively. An anisotropic conductive film (ACF) including binders (insulating resin) 111-1 and conductive particles 112-1 is attached to the lands 91 and the lands 93a (through-holes 93). An anisotropic conductive film including binders 111-2 and conductive particles 112-2 is attached to the lands 92 and the lands 93b (through-holes 93). In this way, the circuit substrate 61 and the spacer substrates 63, and the circuit substrate 62 and the spacer substrates 63 are electrically and mechanically connected. Consequently, the circuit substrate 61 and the circuit substrate 62 are electrically and mechanically connected.

In this case, the sealing resin 102-1 interposed between the lands 91 and 93a electrically connect the lands 91 and 93a, and the sealing resin 102-2 interposed between the lands 92 and 93b electrically connect the lands 92 and 93b.

The solder, the metal paste, and the ACFs are composed of material that can be removed by applying heat or pressure.

The connection method illustrated in FIG. 5A using the solder 94-1 and 94-2 does not require special equipment for establishing a connection and has a lower connection resistance and a larger the connection pitch compared to the methods using the metal paste or the ACFs. The connection method illustrated in FIG. 5B using the metal pastes 101-1 and 101-2 requires higher connection cost and has a higher connection resistance and a smaller connection pitch compared to the method using solder. The connection method illustrated in FIG. 5C using the ACFs requires a higher connect cost and has a small connection pitch compared to the method using the solder and requires special equipment for attaching the ACFs.

The connection method for the circuit substrates 61 and 62 and the spacer substrates 63 is not limited to the above-described methods, and other methods may be employed.

Figure 6:
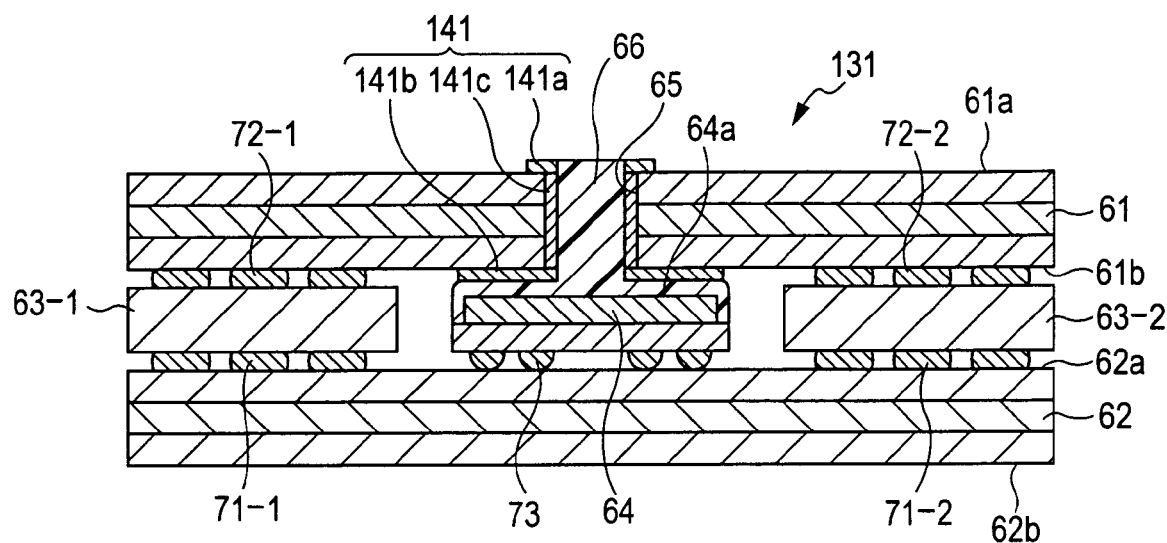
FIG. 6 is a sectional side view of a variation of the electronic circuit device illustrated in FIG. 3.

FIG. 6 is a sectional side view of an electronic circuit device according to another embodiment of the present invention. An electronic circuit device 131 has the same structure as that of the electronic circuit device 51 illustrated in FIG. 3 except that a through-hole 141 is formed inside the through-hole 65.

More specifically, the through-holes 141 including a metal thin film 141a and metal thin film 141b provided on the uppermost surface 61a and the lowermost surface 61b, respectively, is formed inside the through-hole 65 in the circuit substrate 6. The inside of the through-holes 65 and the space between the through-holes 65 (or the metal thin films 141b) and the electronic components 64 are filled with the heat-dissipation resin 66 such that the upper surfaces 64a of the electronic components 64 is covered with the heat-dissipation resin 66.

The through-holes 141 are formed by plating the through-hole 65 with copper so as to form a metal thin film 141c in contact with the inner wall of the through-hole 65, plating the metal thin film 141a on the uppermost surface 61a of the circuit substrate 61 together with the metal thin film 141c of the through-hole 65, and plating the metal thin film 141b on the uppermost lowermost surface 61b together with the metal thin film 141c of the through-hole 65. As illustrated in FIG. 6, the size of the metal thin film 141b on the lowermost surface 61b is substantially the same size as the electronic component 64.

As described above, the inside of the through-hole 65 where the through-hole 144 is formed and the space between the metal thin film 141b (i.e., the opening of the through-hole 65 on the lowermost surface 61b) and the electronic component 64 are filled with the heat-dissipation resin 66 such that the upper surface 64a of the electronic component 64 is covered with the heat-dissipation resin 66. In this way, heat generated by the electronic components 64 is dissipated to the electric circuit formed on the circuit substrate 61 by copper foil through the heat-dissipation resin 66 and the through-hole 141.

In other words, by forming the through-holes 141 including the metal thin films 141a, 141b, and 141c in the electronic circuit device 131, the heat conductivity rate of the electronic circuit device 131 is improved compared to an electronic circuit 51 substrate only including the heat-dissipation resin 66. Thus, heat generated by the electronic component 64 is dissipated more efficiently.

In the electronic circuit device 131, a heat-dissipation fan described below with reference to FIG. 8 may be disposed on the circuit substrate 61 in a manner such that the fan contacts the metal thin film 141a on the uppermost surface 61a. In this way, heat generated by the electronic component 64 and dissipated by the heat-dissipation resin 66 and the through-hole 141 can be quickly cooled by the fan.

As illustrated in FIG. 6, the size of the metal thin film 141b on the lowermost surface 61b is substantially the same as the size of the electronic component 64 so as to increase the area in contact with the heat-dissipation resin 66 and to increase the heat-dissipation efficiency. However, the size of the metal thin film 141b is not limited and may be any size so song as the metal thin film 141b is in contact with the heat-dissipation resin 66.

Figure 7:
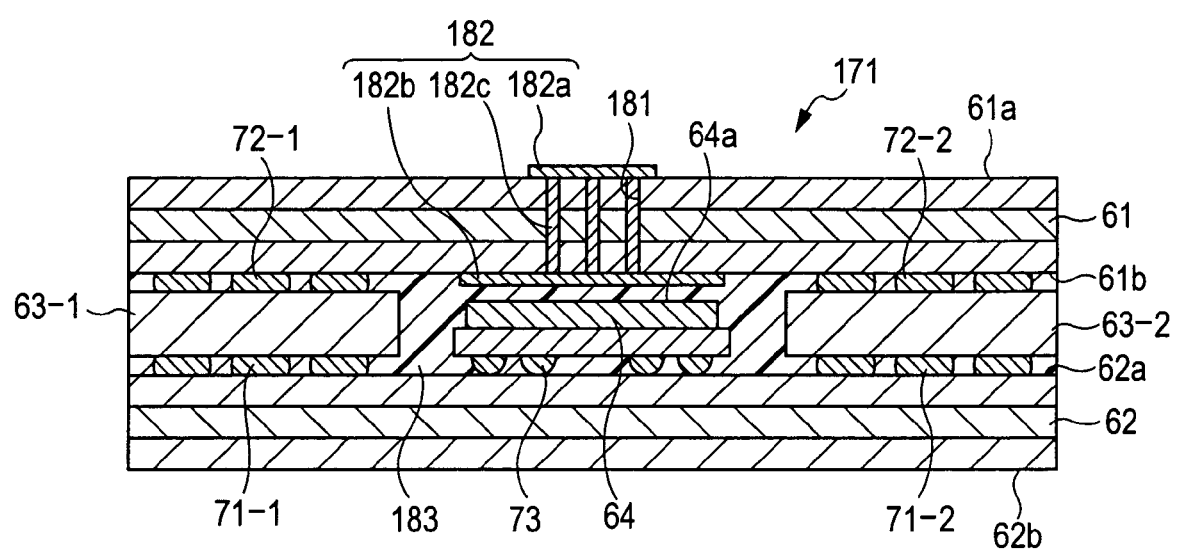
FIG. 7 is a sectional side view of an electronic circuit device according to another embodiment of the present invention.

FIG. 7 is a sectional side view illustrating an electronic circuit device according to another embodiment of the present invention. An electronic circuit device 171, as illustrated in FIG. 7, has the same structure as the above-described electronic circuit device 51 illustrated in FIG. 3 except that through-holes 181 are formed instead of the through-hole 65 and heat-dissipation vias 182 are formed inside the through-holes 181.

More specifically, on the circuit substrate 61 of the electronic circuit device 171, three through-holes 181 penetrating through the circuit substrate 61 from the uppermost surface 61a to the lowermost surface 61b are formed substantially directly above the electronic component 64 disposed on and connected to the circuit substrate 62. The heat-dissipation vias 182 are provided inside the through-holes 181. Each of the heat-dissipation vias 182 includes a metal thin film 182a provided on the uppermost surface 61a, a metal thin film 182b provided inside each of the through-holes 181, and a metal thin film 182c provided on the lowermost surface 61b.

The diameter of each of the through-holes 181 is, for example, 0.3 mm. Each of the heat-dissipation vias 182 is formed by forming the metal thin films 182c by plating the inner surface of one of the through-holes 181 with copper so as to fill the through-hole 181 with copper plating, plating the metal thin film 182a provided on the uppermost surface 61a of the circuit substrate 61 together with the metal thin films 182c in the through-hole 181, and plating the metal thin film 182b provided on the lowermost surface 61b together with the metal thin film 182c in the through-hole 181. As illustrated in FIG. 6, the size of the metal thin film 182b on the lowermost surface 61b is substantially the same as the size of the electronic component 64.

In the electronic circuit device 171, the space between the circuit substrates 61 and 62 is filled with heat-dissipation resin 183 so that the metal thin films 182b of the lowermost surface 61b of the circuit substrate 61 are connected to the electronic component 64 via the heat-dissipation resin 183. The space between the circuit substrates 61 and 62 is filled with heat-dissipation resin 183 from a side wall of the electronic circuit device 171 between the circuit substrates 61 and 62.

As described above, in the electronic circuit device 171, the space between the heat-dissipation vias 182 (metal thin films 182b) and the electronic component 64 is filled with the heat-dissipation resin 183. In this way, heat generated by the electronic component 64 is dissipated through the heat-dissipation resin 183 and the heat-dissipation vias 182 to the electronic circuit formed by copper foil on the circuit substrate 61.

In other words, in the electronic circuit device 171, the heat-dissipation vias 182 including the metal thin films 182a, 182b, and 182c are provided on the circuit substrate 61 so as to increase the heat conductivity rate compared to the electronic circuit device 51 only including the heat-dissipation resin 66 and efficiently dissipate the heat generated by the electronic component 64.

In the electronic circuit device 171, a heat-dissipation fan described below with reference to FIG. 8 may be disposed on the circuit substrate 61 in a manner such that the fan contacts the metal thin films 182a on the uppermost surface 61a. In this way, heat generated by the electronic component 64 and dissipated by the heat-dissipation resin 183 and the heat-dissipation vias 182 can be quickly cooled by the fan.

As illustrated in FIG. 7, the size of the metal thin films 182b on the lowermost surface 61b is substantially the same as the size of the electronic component 64 so as to increase the area in contact with the heat-dissipation resin 183 and to increase the heat-dissipation efficiency. However, the size of the metal thin films 182b is not limited and may be any size so song as the metal thin films 182b is in contact with the heat-dissipation resin 183.

In the electronic circuit device 171 illustrated in FIG. 7, the heat-dissipation vias 182 are formed on the circuit substrate 61 substantially directly above the electronic component 64. However, the position of the heat-dissipation vias 182 is not limited and may be any position so long as the metal thin films 182b of the heat-dissipation vias 182 is in contact with the heat-dissipation resin 183 in contact with the electronic components 64.

Figure 8:
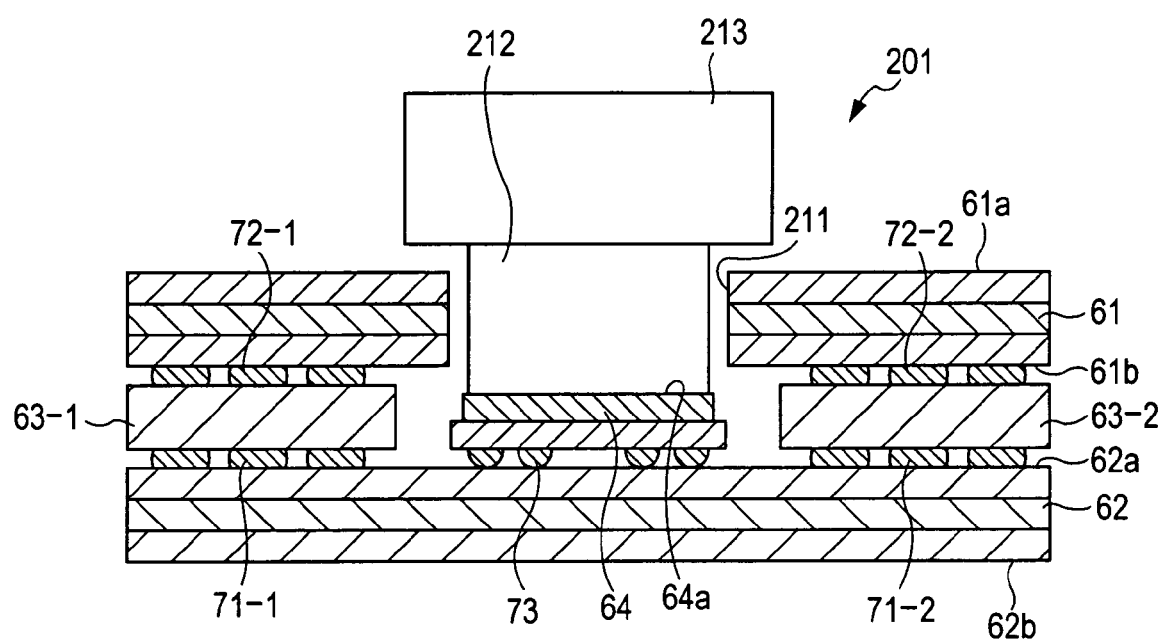
FIG. 8 is a sectional side view of an electronic circuit device according to another embodiment of the present invention.

FIG. 8 is a sectional side view of an electronic circuit device according to an embodiment of the present invention. An electronic circuit device 201, as illustrated in FIG. 8, has the same structure as the electronic circuit device 51 illustrated in FIG. 3 except that a through-hole 211 is formed and a heat sink 212 and a fan 213 are provided.

More specifically, on the circuit substrate 61 of the electronic circuit device 201, the through-hole 211 penetrating through the circuit substrate 61 from the uppermost surface 61a to the lowermost surface 61b is formed substantially directly above the electronic component 64 disposed on and connected to the circuit substrate 62. The diameter of the through-hole 211 is larger than the planar size of the heat sink 212 so that the heat sink 212 can be passed through the through-hole 211 from the uppermost surface 61a to the lowermost surface 61b.

On the upper surfaces (surface opposing the active surface) of the electronic components 64, the heat sink 212 composed of a heat-dissipating metal plate, is disposed inside the through-hole 211 in a manner such that the heat sink 212 protrudes from the uppermost surface 61a of the circuit substrate 61. The heat sink 212 is connected to the electronic components 64 with a bonding member, such as solder. The planar size of the heat sink 212 is substantially the same as the size of the electronic component 64. The height of the heat sink 212 (length in the vertical direction in the drawing) is not limited so long as the heat sink 212 protrudes from the uppermost surface 61a when disposed in the through-hole 211 of the circuit substrate 61 and connected to the electronic component 64.

The heat-dissipating fan 213 is connected to the heat sink 212, which is connected to the electronic component 64 with a bonding member, such as solder, and protrudes from the through-hole 211. The fan 213 is mechanically fixed to, for example, the circuit substrate 61 by connecting members, such as screws (not illustrated in the drawing).

As described above, in the electronic circuit device 201, the heat sink 212 is connected to the upper surface 64a of the electronic component 64 of the circuit substrate 62 and the heat-dissipating fan 213 is connected to the heat sink 212. In this way, heat generated by the electronic component 64 is dissipated to the heat sink 212, and the fan 213 can quickly cool the heat.

As illustrated in FIG. 8, the size of the heat sink 212 is substantially the same as the size of the electronic component 64 so as to increase the area in contact with the electronic components 64 and to increase the heat-dissipation efficiency. However, the size of the heat sink 212 is not limited.

Figure 9:
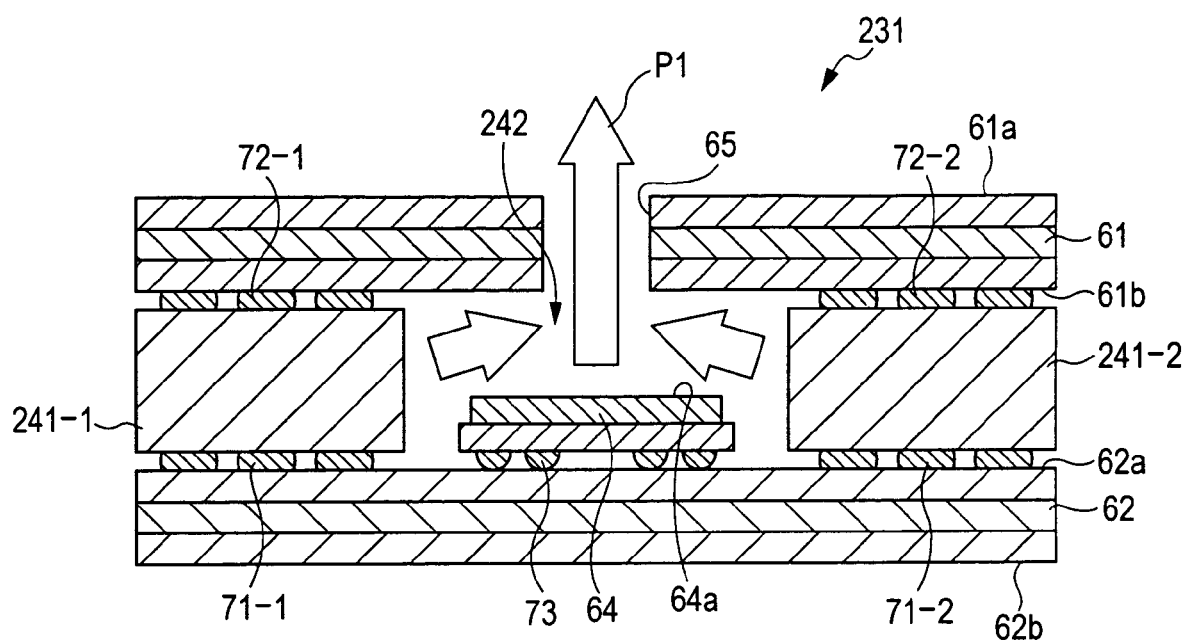
FIG. 9 is a sectional side view of an electronic circuit device according to another embodiment of the present invention.

FIG. 9 is a sectional side view of an electronic circuit device according to an embodiment of the present invention. An electronic circuit device 231, as illustrated in FIG. 9, has the same structure as the electronic circuit device 51 illustrated in FIG. 3 except that spacer substrates 241-1 and 241-2 are provided instead of the spacer substrates 63-1 and 63-2 and the heat-dissipation resin 66 is not used. Hereinafter, when the spacer substrates 241-1 and 241-2 do not have to be distinguished from each other, the spacer substrates 241-1 and 241-2 will be referred to as 'spacer substrates 241.'

The structure of the spacer substrates 241 is the same as the structure of the spacer substrates 63 except for the thickness. The thickness of the spacer substrates 241 is greater than the thickness of the spacer substrates 63. The thickness of the spacer substrates 241, for example, is 1.6 mm.

In the electronic circuit device 231, a large space 242 is formed between the circuit substrate 61 and the circuit substrate 62, i.e., above the upper surface 64a of the electronic component 64 disposed on and connected to the circuit substrate 62. In this way, the amount of airflow between the circuit substrate 61 and the circuit substrate 62 increases compared to the airflow in the electronic circuit device 51 illustrated in FIG. 4. Accordingly, heat generated by the electronic component 64 is carried away together with the air flowing through the through-hole 65 formed in circuit substrate 61 in a direction indicated by an arrow P1 in the drawing. In this way, the heat is dissipated.

In other words, since the heat-dissipation resin 66 is not used because heat is dissipated by air, production cost of the electronic circuit device 231 can be reduced compared to the production cost of the electronic circuit device 51 illustrated in FIG. 4 since. However, because the heat-dissipation resin 66 is not used, the heat-dissipation efficiency of the electronic circuit device 231 is reduced compared to the electronic circuit device 51.

Figure 10:
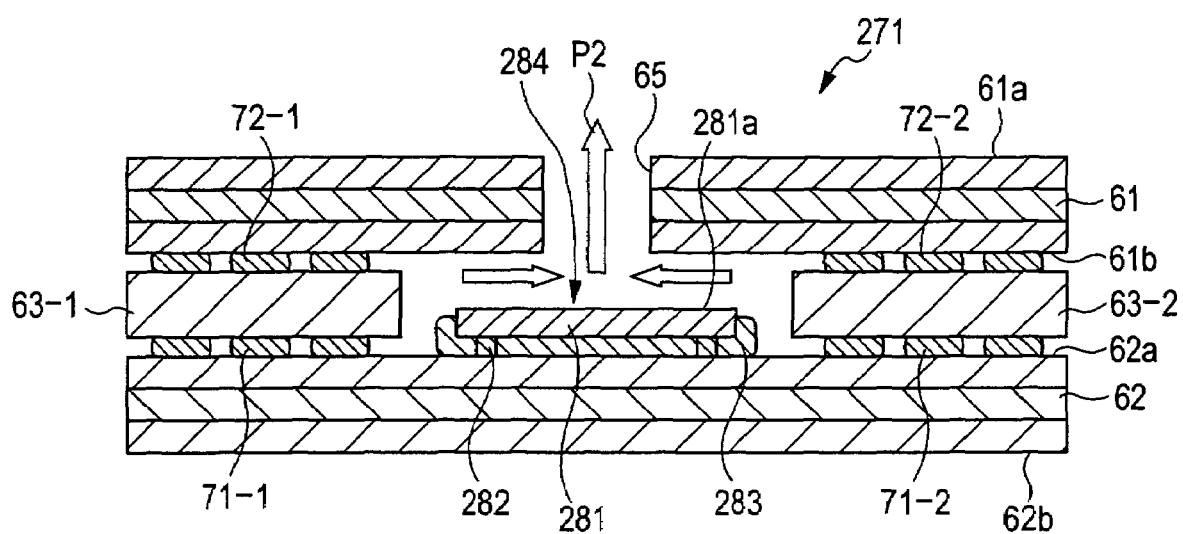
FIG. 10 is a sectional side view of an electronic circuit device according to another embodiment of the present invention.

FIG. 10 is a sectional side view of an electronic circuit device according to another embodiment of the present invention. An electronic circuit device 271, as illustrated in FIG. 10, has the same structure as the structure of the electronic circuit device 51 illustrated in FIG. 3 except that a semiconductor chip 281 is disposed on and connected to the electronic circuit device 271 instead of the electronic component 64 and the heat-dissipation resin 66 is not used.

In the electronic circuit device 271, the high-heat generating semiconductor chip 281, such as a central processing unit (CPU), a memory, or a digital signal processor (DSP), is directly disposed on the circuit substrate 62 with its active surface facing downward (i.e., facing the circuit substrate 62). Bumps 282 are provided on an electrode (not shown in the drawing) of the semiconductor chip 281. The bumps 282 and lands formed on the uppermost surface 62a of the circuit substrate 62 are connected by a bonding member, such as solder, so as to electrically and mechanically connect the semiconductor chip 281 and the circuit substrate 62.

In the electronic circuit device 271, the space between the semiconductor chip 281 and the circuit substrate 62 is filled with a sealing resin 283 so as to increase the connection strength between the semiconductor chip 281 and the circuit substrate 62 and to prevent intrusion of moisture.

As described above, in this electronic circuit device 271, the semiconductor chip 281 is not packaged and instead is directly disposed on and connected to the circuit substrate 62. Thus, the height of the semiconductor chip 281 can be reduced compared to the height of the electronic component 64 illustrated in FIG. 4. Accordingly, a larger space compared to the electronic circuit device 51 illustrated in FIG. 4 can be formed between the circuit substrate 61 and the circuit substrate 62, i.e., above the upper surface 281a of the semiconductor chip 281 disposed on and connected to the circuit substrate 62.

In this way, the amount of airflow between the circuit substrate 61 and the circuit substrate 62 is increased compared to the amount of airflow in the electronic circuit device 51 illustrated in FIG. 4. Accordingly, heat generated by the electronic semiconductor chip 281 is carried away together with the air flowing through the through-hole 65 formed in circuit substrate 61 in a direction indicated by an arrow P2 in the drawing. In this way, the heat is dissipated.

In other words, when the semiconductor chip 281 is directly disposed on and connected to the circuit substrate 62, the thickness of the semiconductor chip 281 will be smaller than the thickness of the electronic components 64, which is packaged.

Also in the electronic circuit device 51 illustrated in FIG. 4, the electronic circuit device 131 illustrated in FIG. 6, the electronic circuit device 171 illustrated in FIG. 7, or the electronic circuit device 201 illustrated in FIG. 8, the same effects as described above may be achieved by providing the semiconductor chip 281, which is disposed on and connected to circuit substrate 62, instead of the electronic component 64.

Figure 11:
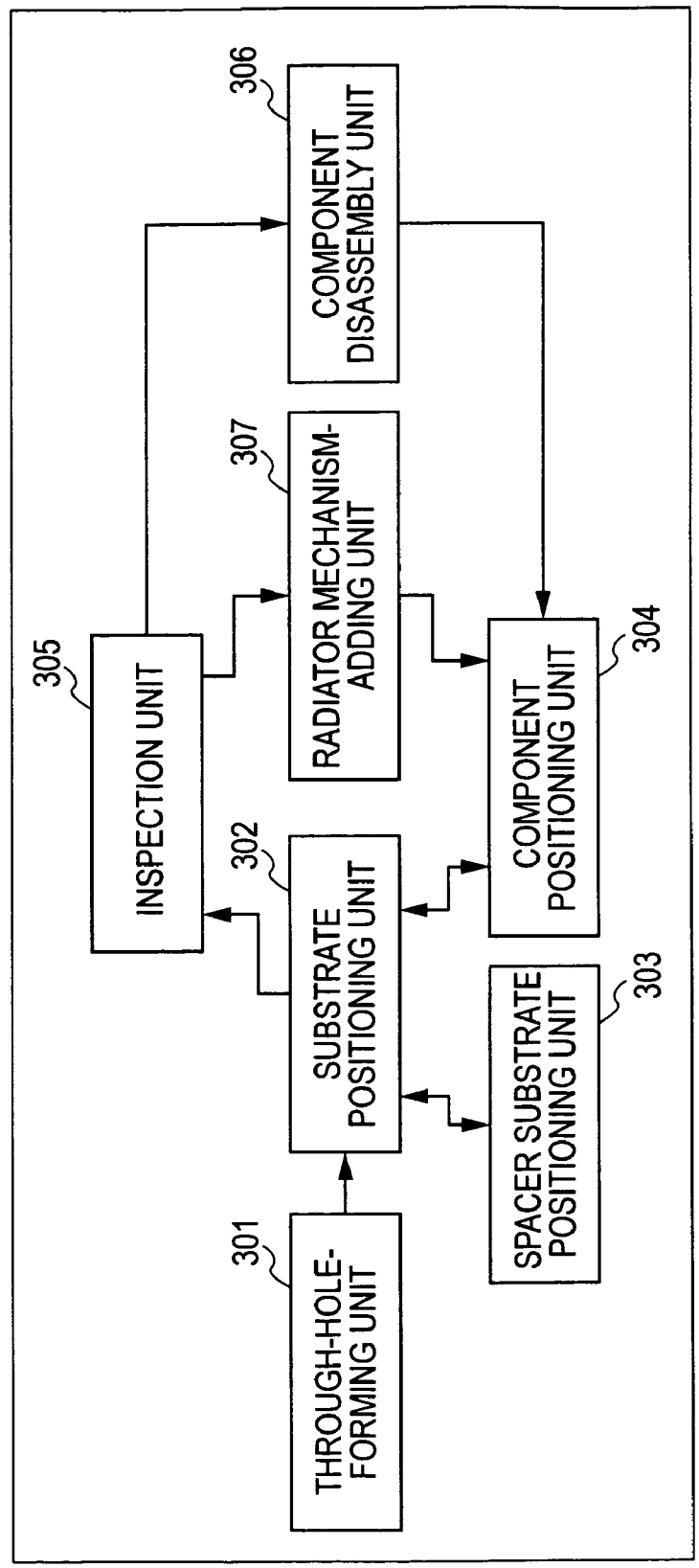
FIG. 11 is a block diagram of a packaging apparatus for an electronic circuit device according to an embodiment of the present invention.

FIG. 11 is a block diagram illustrating the structure of a packaging apparatus for carrying out a packaging process of an electronic circuit device according to an embodiment of the present invention. The packaging apparatus includes a through-hole-forming unit 301, a substrate positioning unit 302, a spacer substrate positioning unit 303, a component positioning unit 304, an inspection unit 305, a component disassembly unit 306, and a radiator-mechanism-adding unit 307.

The through-hole-forming unit 301 obtains the circuit substrate 61 and forms a through-hole at a predetermined position on the circuit substrate 61. The through-hole-forming unit 301 forms a through-hole and heat-dissipation vias inside the through-hole if required.

The substrate positioning unit 302 obtains the circuit substrate 62, where an electronic component is disposed, and the circuit substrate 61 having the through-holes at predetermined positions. The substrate positioning unit 302 reverses the electronic circuit device so as to stack the circuit substrate 61 on the circuit substrate 62 and to dispose the electronic component on the lowermost surface 62b of the circuit substrate 62 and the uppermost surface 61a of the circuit substrate 61 and then connect the electronic component to the circuit substrates 61 and 62.

The spacer substrate positioning unit 303 obtains the spacer substrate 63 (or a plurality of the spacer substrate 63 depending on the predetermined number of spacer substrate 63 to be used) and disposes the spacer substrates 63 in a manner such that the lands formed on the lower surface of the spacer substrates 63 are aligned with the lands formed on the uppermost surface 61a of the circuit substrate 61. Then, the spacer substrate positioning unit 303 electrically and mechanically connects the spacer substrates 63 to the circuit substrate 61 by a bonding member, such as solder, metal paste, or an ACF.

The component positioning unit 304 disposes the electronic component, such as a semiconductor chip, a chip-type electronic component, a resistor, or a capacitor, at a predetermined position on the uppermost surface 62a of the circuit substrate 62, the lowermost surface 62b of the circuit substrate 62, or the uppermost surface 61a of the circuit substrate 61 stacked on the circuit substrate 62 and then electrically and mechanically connects the electronic component to the circuit substrate 62 or the circuit substrate 61 with a bonding member, such as solder, metal paste, or an ACF.

The inspection unit 305 inspects the electronic circuit device. The electronic circuit device to be inspected includes the electronic component disposed at a predetermined position on the uppermost surface 62a of the circuit substrate 62 and connected to the circuit substrate 62 and also includes the circuit substrate 61 stacked the circuit substrate 62. In other words, the inspection unit 305 activates the electronic circuit device so as to check whether or not there are any defects in the circuit substrate, the spacer substrate, and/or the electronic component and/or any faulty connections.

If a defect is detected by the inspection unit 305, the component disassembly unit 306 removes the circuit substrate, the spacer substrate, and/or the electronic component from the electronic circuit device by applying heat or force.

The radiator-mechanism-adding unit 307 uses a dispenser (not shown in the drawings) to inject the heat-dissipating resin in through-holes or from the side of the electronic circuit device, connects the heat sink to the electronic component, and/or connect the fan to the heat sink, the head-dissipating vias, and/or the through-hole.

Figure 12:
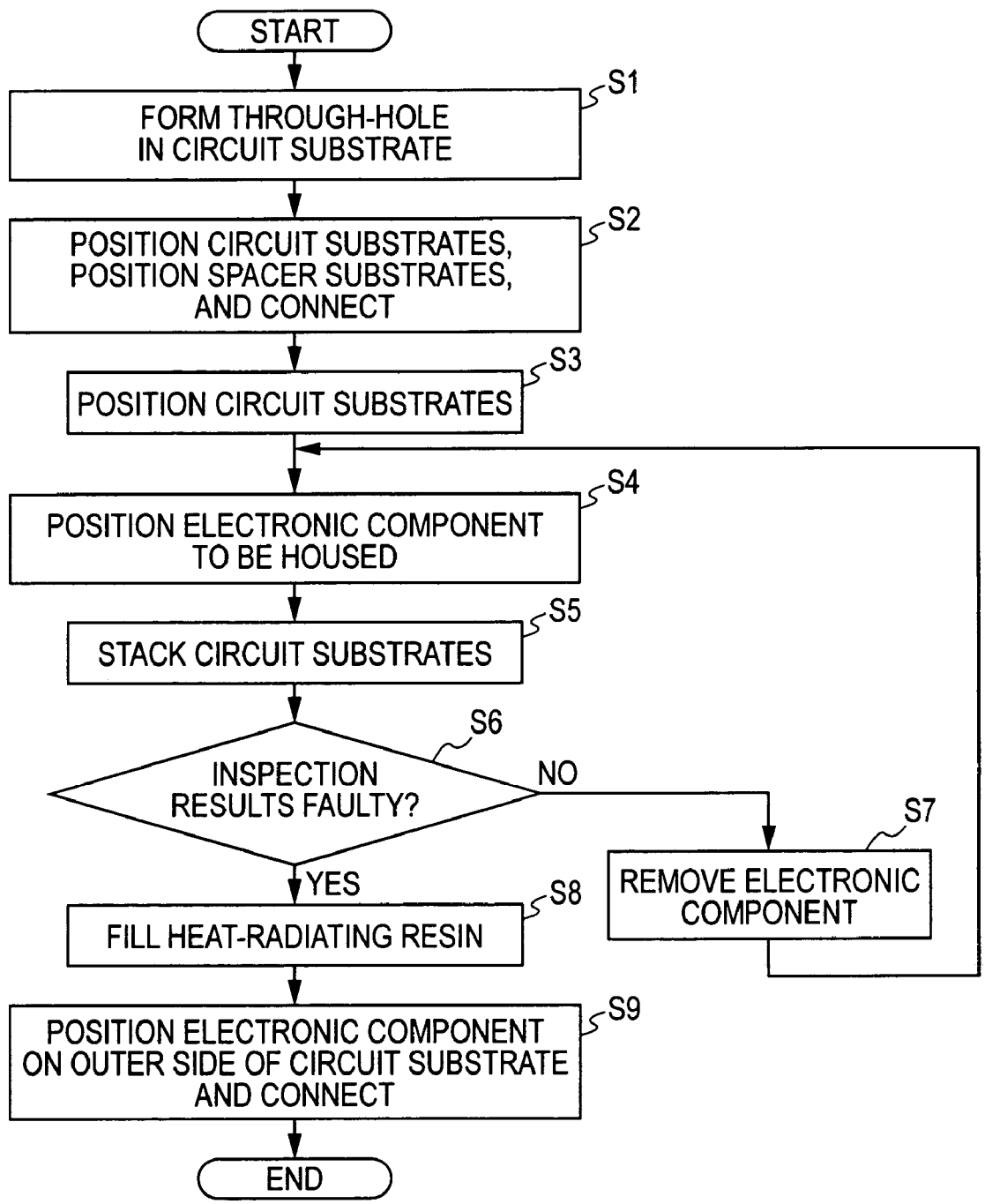
FIG. 12 is a flow chart illustrating a packaging process for an electronic circuit device according to an embodiment of the present invention.

Next, the packaging process of an electronic circuit device according to an embodiment of the present invention will be described with reference to the flow chart in FIG. 12 and the process drawings in FIGS. 13, 14, and 15. The flow chart in FIG. 12 illustrates the packaging process of an electronic circuit device having the same radiator mechanism as that of the electronic circuit device 51 illustrated in FIG. 4 (i.e., including the through-hole 65 and the heat-dissipation resin 66).

Figure 15:
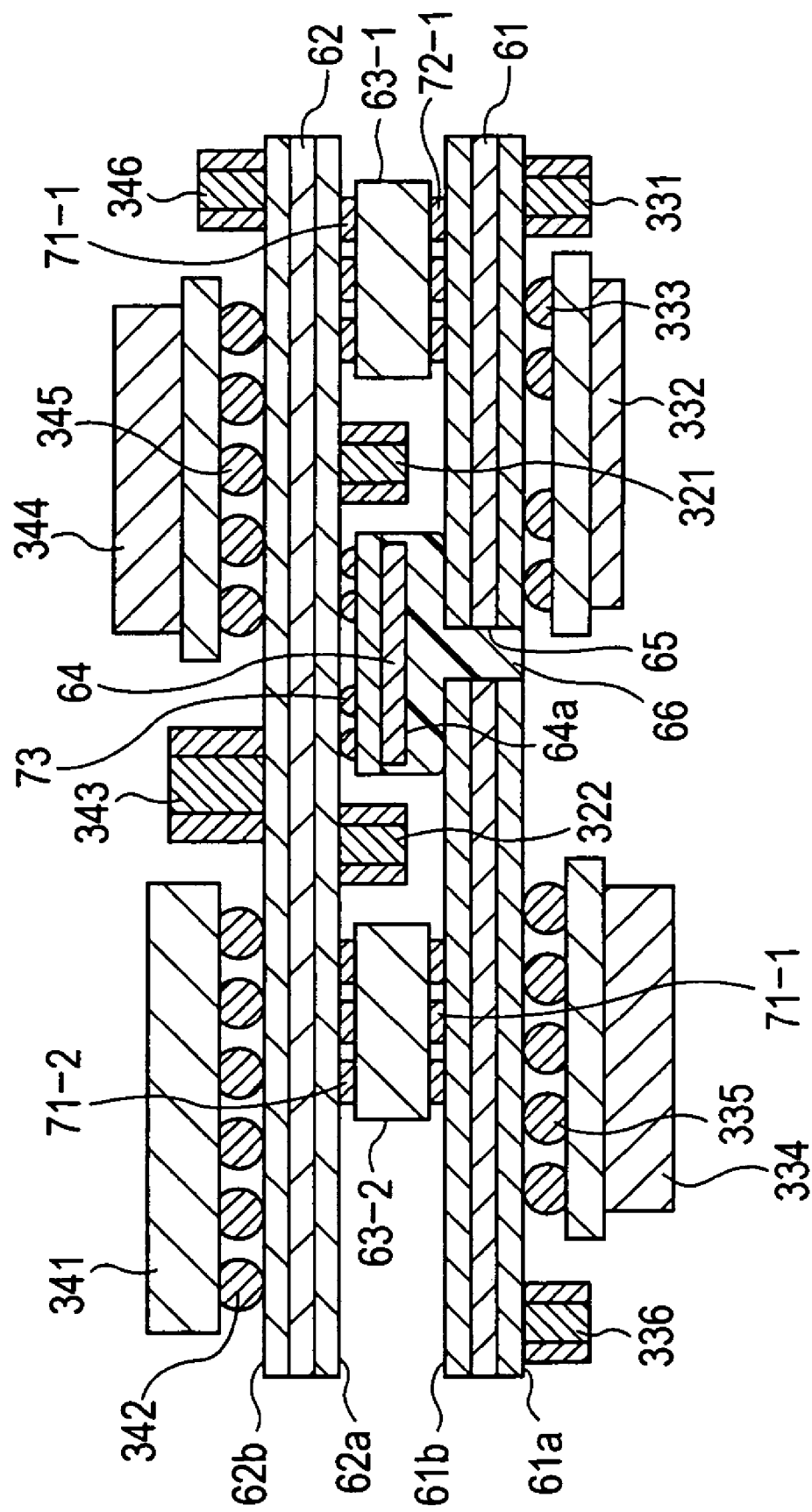
FIG. 15 illustrates steps in a packaging process for an electronic circuit device according to an embodiment of the present invention.

In FIGS. 13 to 15, the components that are the same as those illustrated in FIG. 4 are represented by the same reference numerals and their descriptions are omitted.

In Step S1, the through-hole-forming unit 301 obtains the circuit substrate 61 and forms a through-hole at a predetermined position on the circuit substrate 61. More specifically, the through-hole-forming unit 301 forms the through-hole 65 that penetrates through the circuit substrate 61 from the uppermost surface 61a to the lowermost surface 61b at a position corresponding to the position where the electronic component is disposed on the circuit substrate 62, which opposes the circuit substrate 61 when stacked.

In Step S2, the substrate positioning unit 302 obtains the circuit substrate 61 having the through-hole 65 formed by the through-hole-forming unit 301 at a predetermined position. Also in this step, the spacer substrate positioning unit 303 obtains the spacer substrate 63 and disposes the spacer substrates 63 on the uppermost surface 61a of the circuit substrate 61 in a manner such that the lands formed on the lower surface of the spacer substrates 63 are aligned with the lands formed on the uppermost surface 61a. Then, the spacer substrate positioning unit 303 electrically and mechanically connects the spacer substrates 63 to the circuit substrate 61 by a bonding member, such as solder, metal paste, or an ACF.

Figure 13A:
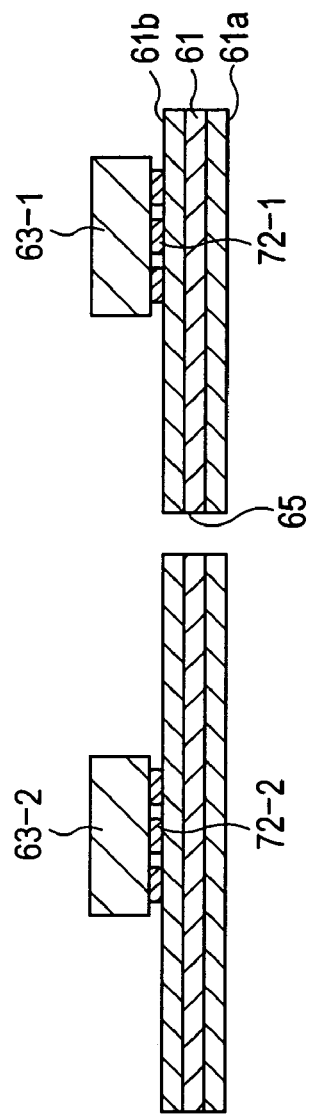
FIG. 13 illustrates steps in a packaging process for an electronic circuit device according to an embodiment of the present invention.

More specifically, the spacer substrate positioning unit 303, who carries out the process from left to right in FIG. 13A, aligns the lands (not shown in the drawings) formed on the lower surface of the spacer substrates 63-2 and 63-1 with the lands formed on the uppermost surface 62a of the circuit substrate 62. Then, as described above with reference to FIG. 5, the spacer substrate positioning unit 303 electrically and mechanically connects the circuit substrate 62 to the spacer substrates 63-2 and 63-1 by using the bonding members 72-2 and 72-1, respectively, which may be solder, metal paste or an ACF.

In Step S3, the substrate positioning unit 302 obtains the circuit substrate 62 and disposes it at a predetermined position.

Figure 13B:
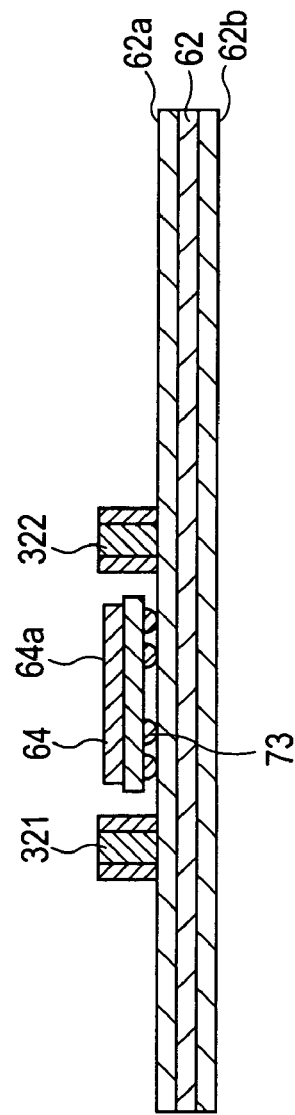

After the circuit substrate 62 is disposed at a predetermined position in Step S3, in the subsequent Step S4, the component positioning unit 304 obtains the electronic components 64, the resistor 321, and the resistor 322 to be embedded between the circuit substrates 61 and 62, as illustrated in FIG. 13B, disposes the component positioning unit 304 obtains the electronic components 64, the resistor 321, and the resistor 322 at predetermined positions on the uppermost surface 62a of the circuit substrate 62, and electrically and mechanically connects the electronic components 64, the resistor 321, and the resistor 322 to the circuit substrate 62 with a bonding member, such as solder, metal paste or an ACF.

More specifically, the component positioning unit 304 disposes the electronic components 64 on the uppermost surface 62a so that the lands formed on the lower surface (surface opposing the circuit substrate 62) of the electronic components 64 are aligned with the lands formed on the uppermost surface 62a of the circuit substrate 62. Then, in the same manner as in the connection method of the spacer substrates 63, the electronic component 64 is electrically and mechanically connected to the circuit substrate 62 by a bonding member, such as solder, metal paste or an ACF.

The component positioning unit 304 disposes the resistor 321 on the uppermost surface 62a so that the electrode (not shown in the drawings) of the resistor 321 is aligned with the lands on the left of the electronic component 64 on the uppermost surface 62a, electrically and mechanically connect the resistor 321 to the circuit substrate 62 with solder, and fixes the resistor 321 on the circuit substrate 62. The component positioning unit 304 disposes the resistor 322 on the uppermost surface 62a so that the electrode (not shown in the drawings) of the resistor 322 is aligned with the lands on the right of the electronic component 64 on the uppermost surface 62a, electrically and mechanically connect the resistor 322 to the circuit substrate 62 with solder, and fixes the resistor 322 on the circuit substrate 62.

Figure 13C:
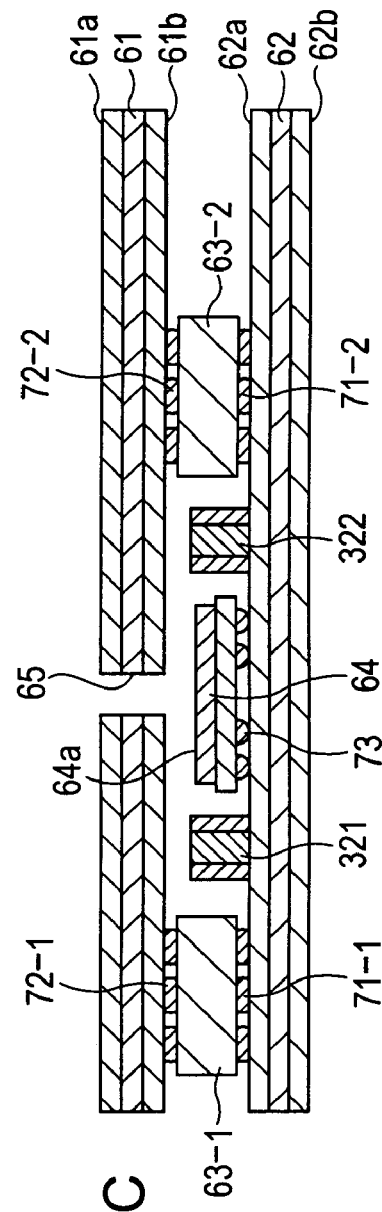

After disposing and connecting the electronic component on the uppermost surface 62a of the circuit substrate 62 in Step 4, in the subsequent Step 5, the substrate positioning unit 302 obtains the circuit substrate 61 (FIG. 13A), which includes the spacer substrates 63 disposed on the circuit substrate 61 by the spacer substrate positioning unit 303, reverses the circuit substrate 61, and stacks the reversed circuit substrate 61 on the circuit substrate 62, as illustrated in FIG. 13C.

More specifically, in Step S5, the substrate positioning unit 302 obtains the circuit substrate 61 (FIG. 13A), which includes the spacer substrates 63 disposed on the circuit substrate 61 by the spacer substrate positioning unit 303 and reverses the circuit substrate 61. Then, the substrate positioning unit 302 disposes the reversed circuit substrate 61 so that lands formed on the lower surface (surface opposing the circuit substrate 62) of the spacer substrates 63-1 and 63-2 connected to the circuit substrate 61 are aligned with the lands formed on the uppermost surface 62a of the circuit substrate 62, electrically and mechanically connects the circuit substrate 62 to the spacer substrates 63-2 and 63-1 by using the bonding members 72-2 and 72-1, respectively, which may be solder, metal paste or an ACF, and, as a result, stacks the circuit substrate 61 on the circuit substrate 62.

After the circuit substrate 61 is stacked on the circuit substrate 62 in Step S5, in the subsequent Step S6, the inspection unit 305 activates the electronic circuit device having the circuit substrate 61 stacked on the circuit substrate 62 so as to determine whether there are any defects or faulty connections in the circuit substrate, the spacer substrate and/or the electronic component.

If defects are found in Step 6, the process proceeds to Step S7 where the component disassembly unit 306 removes the defected circuit substrate, spacer substrate, and/or electronic component from the electronic circuit device by applying heat or force.

Figure 16:
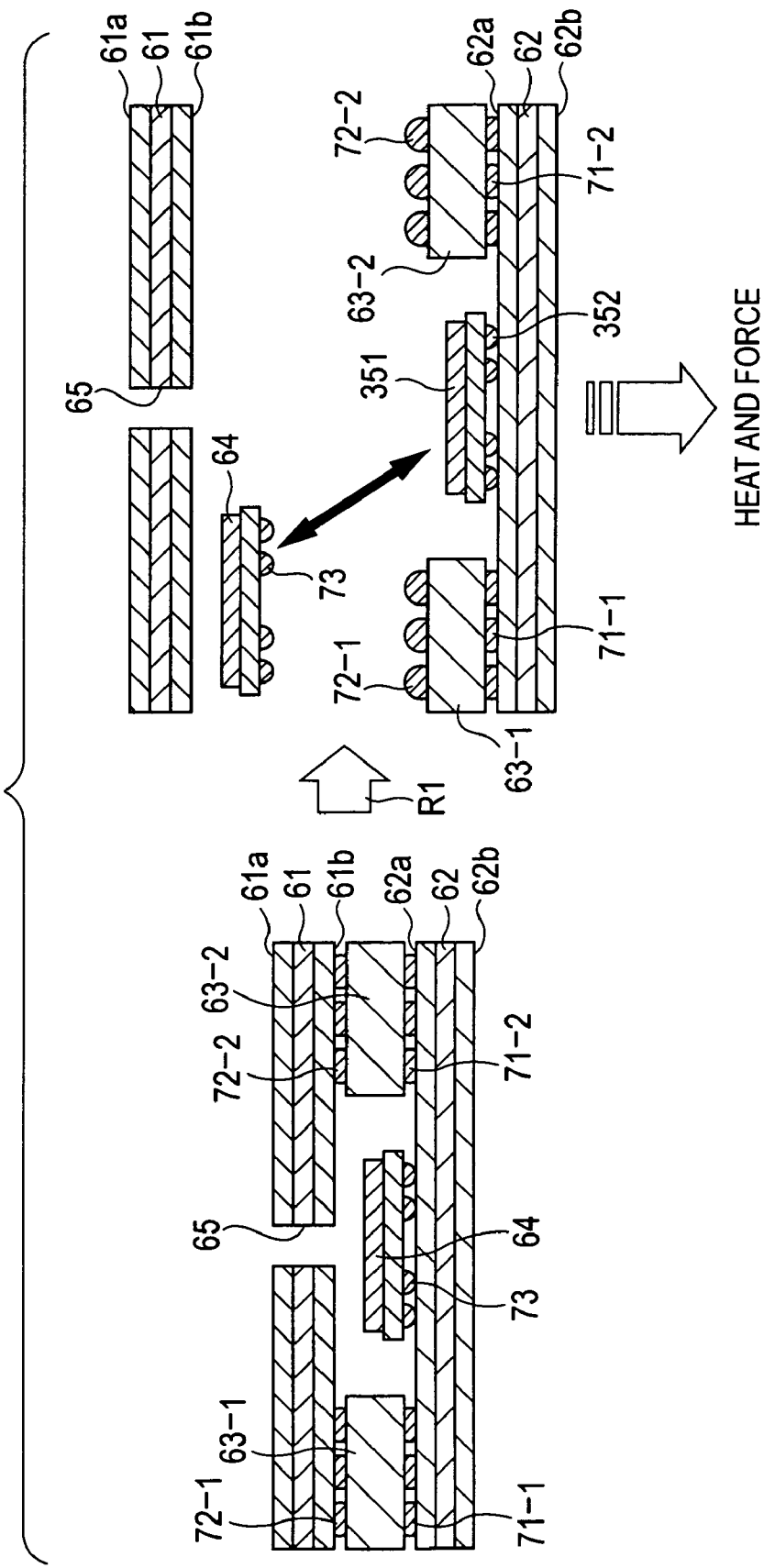
FIG. 16 illustrates the process carried out in Step S6 shown in FIG. 12.

Now, Step 6 will describe in detail with reference to FIG. 16. In FIG. 16, the resistors 321 and 322 are not shown.

For example, if the inspection unit 305 finds a defect in the electronic components 64, the component disassembly unit 306 applies heat or force in the direction indicated by an arrow R1 in the drawing to the circuit substrate 61, the spacer substrates 63, the electronic components 64, or the circuit substrate 62 of the electronic circuit device.

The bonding members 71-1 and 71-2, such as solder, metal paste or an ACF, that connects the circuit substrate 61 and the spacer substrates 63 can be removed by hear or pressure, as described above with reference to FIG. 5. Similarly, the bonding member 73, such as solder, metal paste or an ACF that connects the circuit substrate 62 and the electronic components 64 can be removed by hear or pressure.

Subsequently in Step S7 of FIG. 12, the component disassembly unit 306 removes the circuit substrate 61 from the electronic circuit device by applying heat or pressure and then removes the defected electronic component 64 from the electronic circuit device (circuit substrate 62). Then, the process is returned to Step S4, and Step S4 and the subsequent steps are repeated.

More specifically, in Step S4, the component positioning unit 304 obtains an electronic component 351 that is a replacement for the electronic component 64 and then disposes the electronic component 351 on the uppermost surface 62a so that lands formed on the lower surface (surface opposing the circuit substrate 62) of the electronic component 351 are aligned with lands formed on the uppermost surface 62a of the electronic component 351. The component positioning unit 304 electrically and mechanically connects the electronic component 351 to the circuit substrate 62 by a bonding member 352, such as solder, metal paste or an ACF. Then, steps subsequent to Step 4 are repeated.

Figure 1A:
FIG. 1 illustrates a production process of a known multilayer substrate.
Figure 1B:
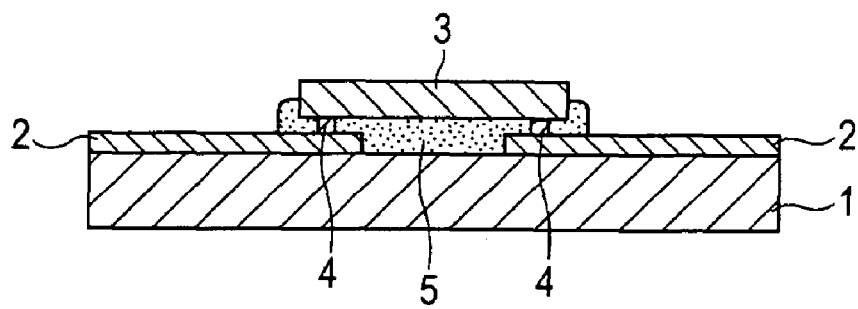
Figure 1C:
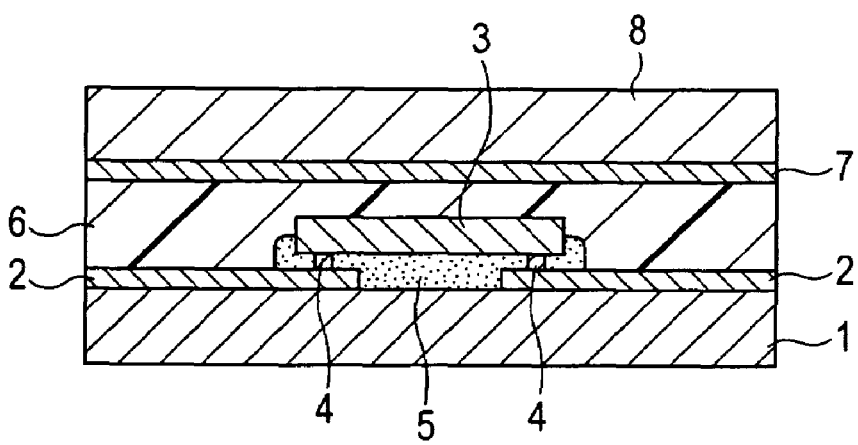
Figure 2:
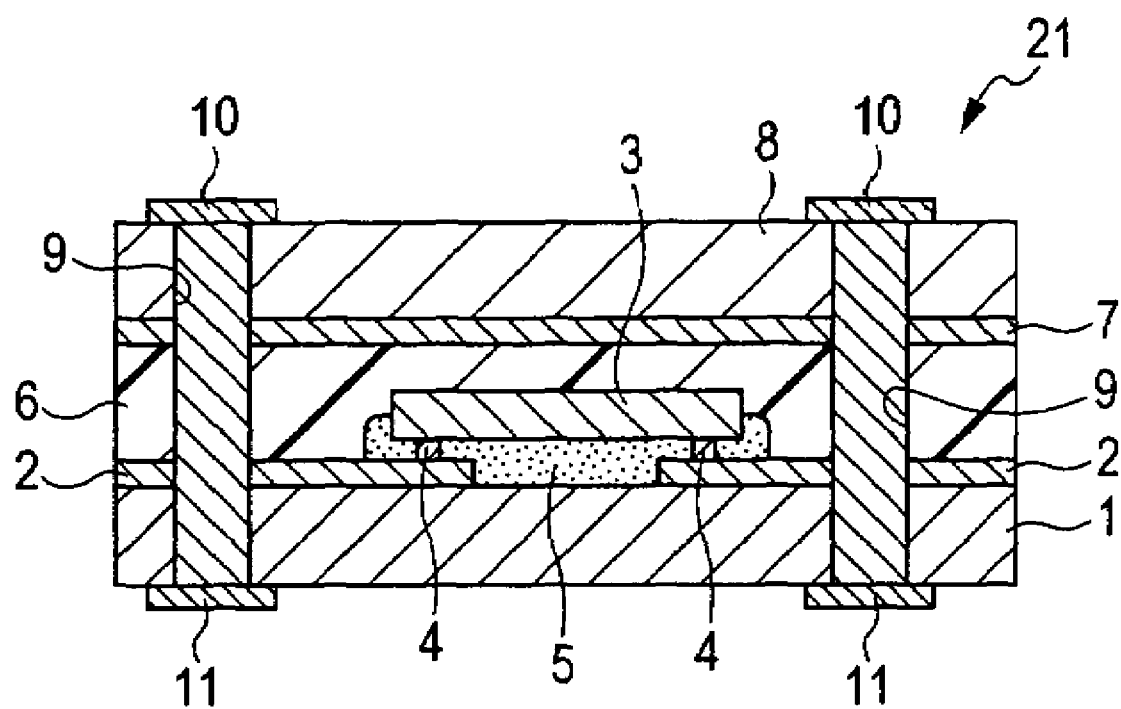
FIG. 2 illustrates a production process of a known multilayer substrate.

As described above, the electronic components are interposed between the stacked circuit substrates and are connected to the circuit substrates with a bonding member removable by applying heat or pressure, unlike the known multilayer substrate 21 described above with reference to FIGS. 1 and 2 in which the electronic components are embedded in the circuit substrate as part of the circuit substrate. Therefore, the electronic components included in the electronic circuit device according to an embodiment of the present invention can be easily removed if defects and/or faulty connections are detected by an inspection after the electronic components are embedded in the circuit substrates and after the circuit substrates are stacked. Accordingly, in the electronic circuit device according to an embodiment of the present invention, for example, a non-defective component can be reconnected and/or a component having a misconnection can be reconnected. In this way, non-defective components are prevented from being discarded.

In Step S6 illustrated in FIG. 12, if no defects are detected, the process proceeds to Step S8 where the radiator-mechanism-adding unit 307 uses a dispenser (not shown in the drawings) to inject the electronic circuit device with the heat-dissipation resin 66 through the through-hole 65, as illustrated in FIG. 14A. More specifically, the radiator-mechanism-adding unit 307 injects the heat-dissipation resin 66 in the through-hole 65 and in the space between the through-hole 65 and the electronic components 64 so that the upper surfaces 64a of the electronic components 64 is covered with the heat-dissipation resin 66.

After, in the Step S8, the heat-dissipation resin 66 injected into the electronic circuit device through the through-hole 65, in the subsequent Step 9, the component positioning unit 304 disposed the electronic components, such as the semiconductor chip, the chip-type electronic component, the resistor, and the capacitor, on outer side of the circuit substrate 61 and the circuit substrate 62 (i.e., the uppermost surface 61a and the lowermost surface 62b) and electrically and mechanically connects the electronic components with the substrates with bonding members, such as solder, metal paste or an ACF.

Now, Step 9 will be described in detail. First, the component positioning unit 304 disposes electronic components on the uppermost surface 61a of the circuit substrate 61 at predetermined position and connects the electronic components with the circuit substrate 61, as illustrated in FIG. 14B. More specifically, the component positioning unit 304, who carries out the process from left to right in drawing, disposes a resistor 331 on the uppermost surface 61a of the circuit substrate 61 so that an electrode (not shown in the drawings) of the resistor 331 is aligned with the lands on the uppermost surface 61a, electrically and mechanically connect the resistor 331 to the circuit substrate 61 with solder, and fixes the resistor 331 on the circuit substrate 61. The component positioning unit 304 disposes a chip-type electronic component 332 on the uppermost surface 61a of the circuit substrate 61 so that lands (not shown in the drawings) of the chip-type electronic component 332 are aligned with the lands on the right of the resistor 331 on the uppermost surface 61a, electrically and mechanically connects the chip-type electronic component 332 to the circuit substrate 61 with a bonding member 333, such solder, metal paste, or an ACF, and fixes the chip-type electronic component 332 on the circuit substrate 61.

The component positioning unit 304 disposes a chip-type electronic component 334 on the uppermost surface 61a of the circuit substrate 61 so that the lands formed on the right of the chip-type electronic component 332 are aligned with lands of the chip-type electronic component 334 (not shown in the drawing), electrically and mechanically connects the chip-type electronic component 334 to the circuit substrate 61 with a bonding member 335, such solder, metal paste, or an ACF, and fixes the chip-type electronic component 334 on the circuit substrate 61. The component positioning unit 304 disposes a resistor 336 on the uppermost surface 61a of the circuit substrate 61 so that the lands formed on the right of the chip-type electronic component 334 are aligned with lands of the resistor 336 (not shown in the drawing), electrically and mechanically connects the resistor 336 to the circuit substrate 61 with solder, and fixes the resistor 336 component 334 on the circuit substrate 61.

After the component positioning unit 304 disposes the electronic components on the uppermost surface 61a of the circuit substrate 61, the substrate positioning unit 302 reverses the electronic circuit device so as to dispose the electronic components on the lowermost surface 62b of the circuit substrate 62 and connect the electronic components to the circuit substrate 62.

After the electronic circuit device is reversed, the component positioning unit 304 disposes the predetermined electronic components on the lowermost surface 62b of the circuit substrate 62, from left to right in FIG. 15. More specifically, the component positioning unit 304 disposes a semiconductor chip 341 on the lowermost surface 62b of the circuit substrate 62 so that lands formed on the lowermost surface 62b are aligned with an electrode (not shown in the drawing) of the semiconductor chip 341, electrically and mechanically connects the semiconductor chip 341 to the circuit substrate 62 with a bonding member 342, such as solder, metal paste, or an ACF, and fixes the semiconductor chip 341 on the circuit substrate 62. The component positioning unit 304 disposes a capacitor 343 on the lowermost surface 62b of the circuit substrate 62 so that the lands formed on the right of the semiconductor chip 341 are aligned with an electrode (not shown in the drawing) of the capacitor 343, electrically and mechanically connects the capacitor 343 to the circuit substrate 62 with solder, and fixes the capacitor 343 on the circuit substrate 62.

The component positioning unit 304 disposes the a chip-type electronic component 344 on the lowermost surface 62b of the circuit substrate 62 so that the lands formed on the right of the capacitor 343 are aligned with lands of the chip-type electronic component 344 (not shown in the drawing), electrically and mechanically connects the chip-type electronic component 344 to the circuit substrate 62 with a bonding member 345, such as solder, metal paste or an ACF, and fixes the chip-type electronic component 344 to the circuit substrate 62. In this way, the chip-type electronic component 334 is fixed the chip-type electronic component 344 on the circuit substrate 62. The component positioning unit 304 disposes the a resistor 346 on the lowermost surface 62b of the circuit substrate 62 so that the lands formed on the right of the chip-type electronic component 344 are aligned with an electrode (not shown in the drawing) of the resistor 346, electrically and mechanically connects the resistor 346 to the circuit substrate 62 with solder, and fixes the resistor 346 to the circuit substrate 62.

As illustrated in FIG. 15, the electronic component 64 is interposed between and connected to the circuit substrates 61 and 62. The through-hole 65 is formed on the circuit substrate 61, which opposes the active surface of the electronic components 64. Then, the through-hole 65 and in the space between the through-hole 65 and the electronic components 64 are filled with the heat-dissipation resin 66 so as to cover the upper surfaces 64a of the electronic components 64, which opposes the active surface of the electronic components 64. Accordingly, the packaging of the electronic circuit device is completed.

As described above, the electronic circuit device according to an embodiment of the present invention includes the spacer substrates 63 interposed between the circuit substrates 61 and 62, the high-heat generating electronic component 64 embedded in the substrates, and a radiating mechanism (for example, the through-hole 65 and the heat-dissipation resin 66 in FIG. 4) for dissipating heat generated by the electronic component 64. In this way, heat generated by the electronic component 64 will not accumulate between the stacked substrates, and malfunction of the electronic components 64 caused by the heat can be prevented.

The above-described electronic circuit device includes a stack of two circuit substrates. However, the number of layers of circuit substrates to be stacked is not limited, and additional substrates may be stacked on the circuit substrate 61 and the circuit substrate 62.

The steps in the flowchart of the process according to an embodiment of the present invention includes, in addition to those carried out sequentially, those that are not carried out sequentially and those carried out simultaneously and/or individually.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic circuit device, comprising:
   at least a first substrate and a second substrate;
   a spacer substrate interposed between the first substrate and the second substrate, the spacer substrate mutually connecting the first substrate and the second substrate;
   an electronic component interposed between the first substrate and the second substrate, the electronic component being connected to the first substrate with an active surface of the electronic component;
   at least one through-hole formed on the second substrate opposing the first substrate, the at least one through-hole beginning from a first surface of the second substrate opposing the first substrate and ending at a second surface of the second substrate; and
   a plated conductive part positioned to contact an inside wall of the through-hole,
   wherein the inside of the through-hole and a space between the through-hole and a surface of the electronic component opposing the second substrate are filled with a resin having high heat conductivity.

2. The electronic circuit device according to claim 1, wherein the electronic component is one of a semiconductor chip and a chip-type electronic component.

3. The electronic circuit device according to claim 1, wherein the plated conductive part contacts the resin filling the space between the through-hole and a surface of the electronic component opposing the second substrate.

4. The electronic circuit device according to claim 1, wherein the plated conductive part electrically connects the first surface of the second substrate and the second surface of the second substrate, the conductive part being in contact with the first surface of the second substrate, and
   at least the space between the conductive part and the surface of the electronic component opposing the second substrate is filled with a resin having high heat conductivity.

5. The electronic circuit device of claim 1, further comprising:
   a first metal film configured to contact the plated conductive part and positioned on an uppermost surface of the second substrate; and
   a second metal film configured to contact the plated conductive part and positioned on a lower most surface of the second substrate.

6. The electronic circuit device of claim 5, wherein a space between the second metal film and the electronic component is filled with a resin having high heat conductivity.

7. The electronic circuit device of claim 1, wherein the plated conductive part includes copper.

8. An electronic circuit device, comprising:
   at least a first substrate and a second substrate;
   a spacer substrate interposed between the first substrate and the second substrate, the spacer substrate mutually connecting the first substrate and the second substrate;
   an electronic component interposed between the first substrate and the second substrate, the electronic component being connected to the first substrate with an active surface of the electronic component;
   at least one through-hole formed on the second substrate opposing the first substrate, the through-hole penetrating from a first surface of the second substrate opposing the first substrate to a second surface of the second substrate,
   wherein the inside of the through-hole and a space between the through-hole and a surface of the electronic component opposing the second substrate are filled with a resin having high heat conductivity;
   a plated conductive part contacting the resin filling the space between the through-hole and a surface of the electronic component opposing the second substrate and contacting an inner wall of the through-hole; and
   a fan contacting the conductive part, the fan being disposed on the second surface of the second substrate.

9. An electronic circuit device, comprising:
   at least a first substrate and a second substrate;
   a spacer substrate interposed between the first substrate and the second substrate, the spacer substrate mutually connecting the first substrate and the second substrate;
   an electronic component interposed between the first substrate and the second substrate, the electronic component being connected to the first substrate with an active surface of the electronic component; and
   at least one through-hole formed on the second substrate opposing the first substrate, the through-hole penetrating from a first surface of the second substrate opposing the first substrate to a second surface of the second substrate;
   a plated conductive part for electrically connecting the first surface of the second substrate and the second surface of the second substrate, the conductive part being in contact with the first surface of the second substrate and the inner surface of the through-hole; and
   a fan contacting the conductive part, the fan being disposed on the second surface of the second substrate,
   wherein at least a space between the conductive part and a surface of the electronic component opposing the second substrate is filled with a resin having high heat conductivity.

10. An electronic circuit device, comprising:
    at least a first substrate and a second substrate;
    a spacer substrate interposed between the first substrate and the second substrate, the spacer substrate mutually connecting the first substrate and the second substrate;
    an electronic component interposed between the first substrate and the second substrate, the electronic component being connected to the first substrate with an active surface of the electronic component; and
    at least one through-hole formed on the second substrate opposing the first substrate, the through-hole penetrating from a first surface of the second substrate opposing the first substrate to a second surface of the second substrate;
    a metal plate contacting the surface of the electronic component opposing the second substrate, passing through the through-hole formed on the second substrate, and protruding from the second surface of the second substrate; and
    a fan contacting the metal plate.

11. An electronic circuit device, comprising:
    at least a first substrate and a second substrate;
    a spacer substrate interposed between the first substrate and the second substrate, the spacer substrate mutually connecting the first substrate and the second substrate;

an electronic component interposed between the first substrate and the second substrate, the electronic component being connected to the first substrate with an active surface of the electronic component;

at least one through-hole formed on the second substrate opposing the first substrate, the at least one through-hole beginning from a first surface of the second substrate opposing the first substrate and ending at a second surface of the second substrate;

a plated conductive part positioned to contact an inside wall of the through-hole; and a heat dissipation fan disposed on the second substrate and configured to contact a first metal film configured to contact the plated conductive part and positioned on an uppermost surface of the second substrate.

12. An electronic circuit device, comprising:

at least a first substrate and a second substrate;

a spacer substrate interposed between the first substrate and the second substrate, the spacer substrate mutually connecting the first substrate and the second substrate;

an electronic component interposed between the first substrate and the second substrate, the electronic component being connected to the first substrate with an active surface of the electronic component;

a plurality of through-holes formed on the second substrate opposing the first substrate, the plurality of through-holes beginning from a first surface of the second substrate opposing the first substrate and ending at a second surface of the second substrate, the first substrate being connected to the electronic component;

a plated conductive part included in the plurality of through-holes; and a heat dissipation fan disposed on the second substrate and configured to contact a first metal film configured to contact the plated conductive part and positioned on an uppermost surface of the second substrate.

13. The electronic circuit device of claim 12, further comprising:

a second metal film configured to contact the plated conductive part and positioned on a lower most surface of the second substrate.

14. The electronic circuit device of claim 13, wherein a space between the second metal film and the electronic component is filled with a resin having high heat conductivity.

15. The electronic circuit device of claim 12, further comprising:

a second metal film positioned on a lower most surface of the second substrate, the second metal film configured to contact the electronic component and a resin having high heat conductivity, the resin positioned to fill a space between plurality of through-holes and the electronic component.

* * * * *